United States Patent
Tokunaga et al.

(10) Patent No.: US 8,212,624 B2
(45) Date of Patent: Jul. 3, 2012

(54) REFERENCE FREQUENCY GENERATION CIRCUIT, SEMICONDUCTOR INTEGRATED CIRCUIT, AND ELECTRONIC DEVICE

(75) Inventors: Yusuke Tokunaga, Hyogo (JP); Shiro Sakiyama, Kyoto (JP); Akinori Matsumoto, Osaka (JP); Shiro Dosho, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/022,029

(22) Filed: Feb. 7, 2011

(65) Prior Publication Data

US 2011/0140754 A1    Jun. 16, 2011

Related U.S. Application Data

(63) Continuation of application No. PCT/JP2009/001270, filed on Mar. 23, 2009.

(30) Foreign Application Priority Data

Aug. 7, 2008   (JP) .................................. 2008-204721
Jan. 29, 2009  (JP) .................................. 2009-018331

(51) Int. Cl.
    *H02K 3/26*   (2006.01)
(52) U.S. Cl. ......................... 331/111; 331/143; 327/131
(58) Field of Classification Search ........................ None
    See application file for complete search history.

(56) References Cited

U.S. PATENT DOCUMENTS

| | | | |
|---|---|---|---|
| 5,870,000 A | 2/1999 | Matsuda et al. | |
| 6,020,792 A | 2/2000 | Nolan et al. | |
| 6,412,977 B1* | 7/2002 | Black et al. | .................... 374/178 |
| 7,317,362 B2* | 1/2008 | Sakuma et al. | ............... 331/111 |
| 2008/0143394 A1 | 6/2008 | Payrard et al. | |
| 2008/0174346 A1 | 7/2008 | Payrard et al. | |
| 2010/0007428 A1 | 1/2010 | Nezuka | |

FOREIGN PATENT DOCUMENTS

| | | |
|---|---|---|
| JP | 04-267620 | 9/1992 |
| JP | 05-226984 | 9/1993 |
| JP | 06-077781 | 3/1994 |
| JP | 06-177719 | 6/1994 |
| JP | 09-107273 | 4/1997 |
| JP | 09-312552 | 12/1997 |
| JP | 10-070440 | 3/1998 |
| JP | 11-298299 | 10/1999 |
| JP | 2001-127592 | 5/2001 |
| JP | 2007-329855 | 12/2007 |

* cited by examiner

*Primary Examiner* — An Luu
(74) *Attorney, Agent, or Firm* — McDermott Will & Emery LLP

(57) ABSTRACT

An oscillator circuit increases and reduces signal levels of first and second oscillation signals in a complementary manner in response to a transition of a signal level of a reference clock. An oscillation control circuit compares each of the signal levels of the first and second oscillation signals to a comparison voltage, and causes the signal level of the reference clock to transition according to results of the comparison. A reference control circuit increases or reduces the comparison voltage so that a difference between a signal level of an intermediate signal which is proportional to respective swings of the first and second oscillation signals and a reference voltage is reduced.

14 Claims, 23 Drawing Sheets

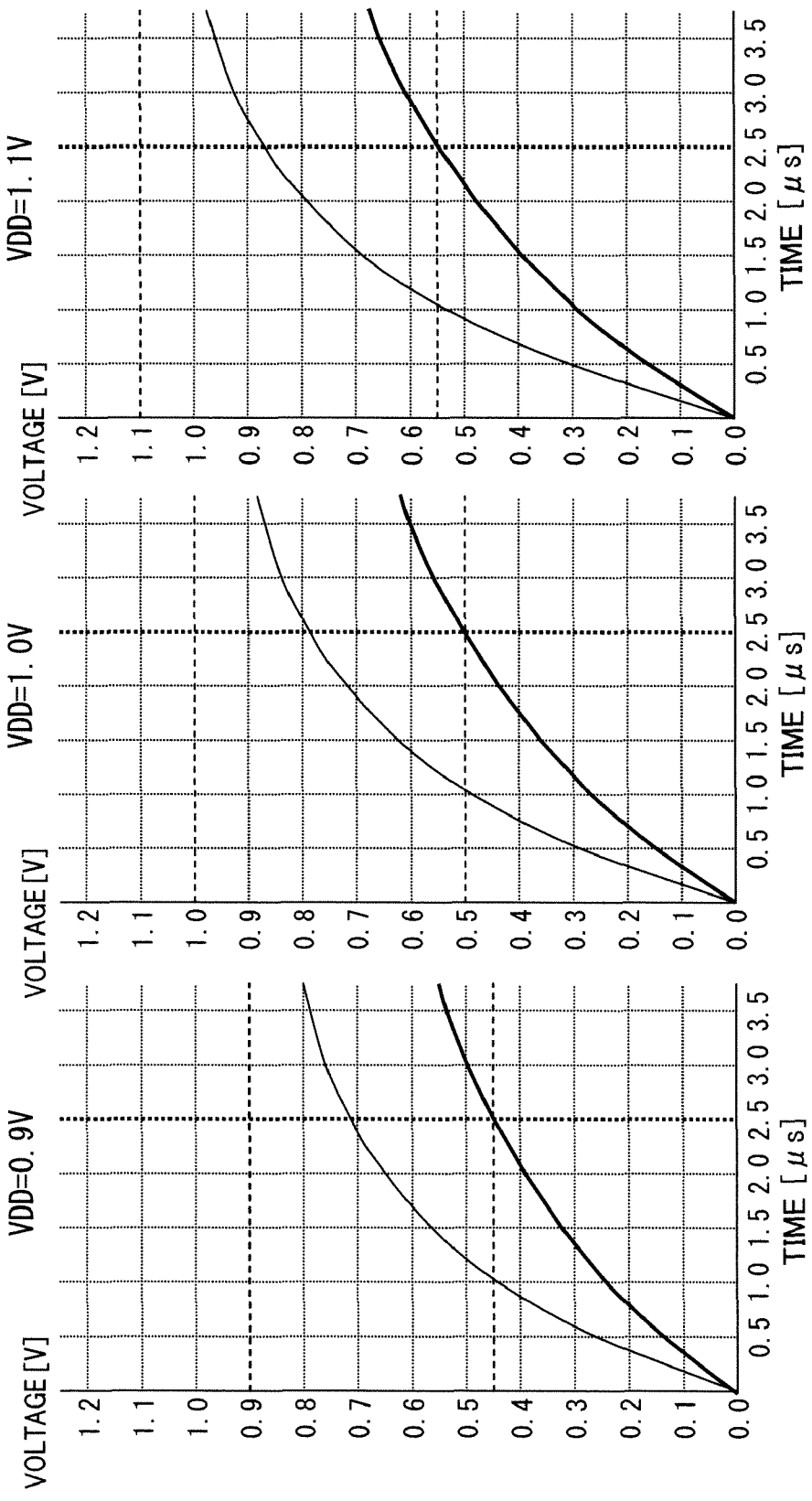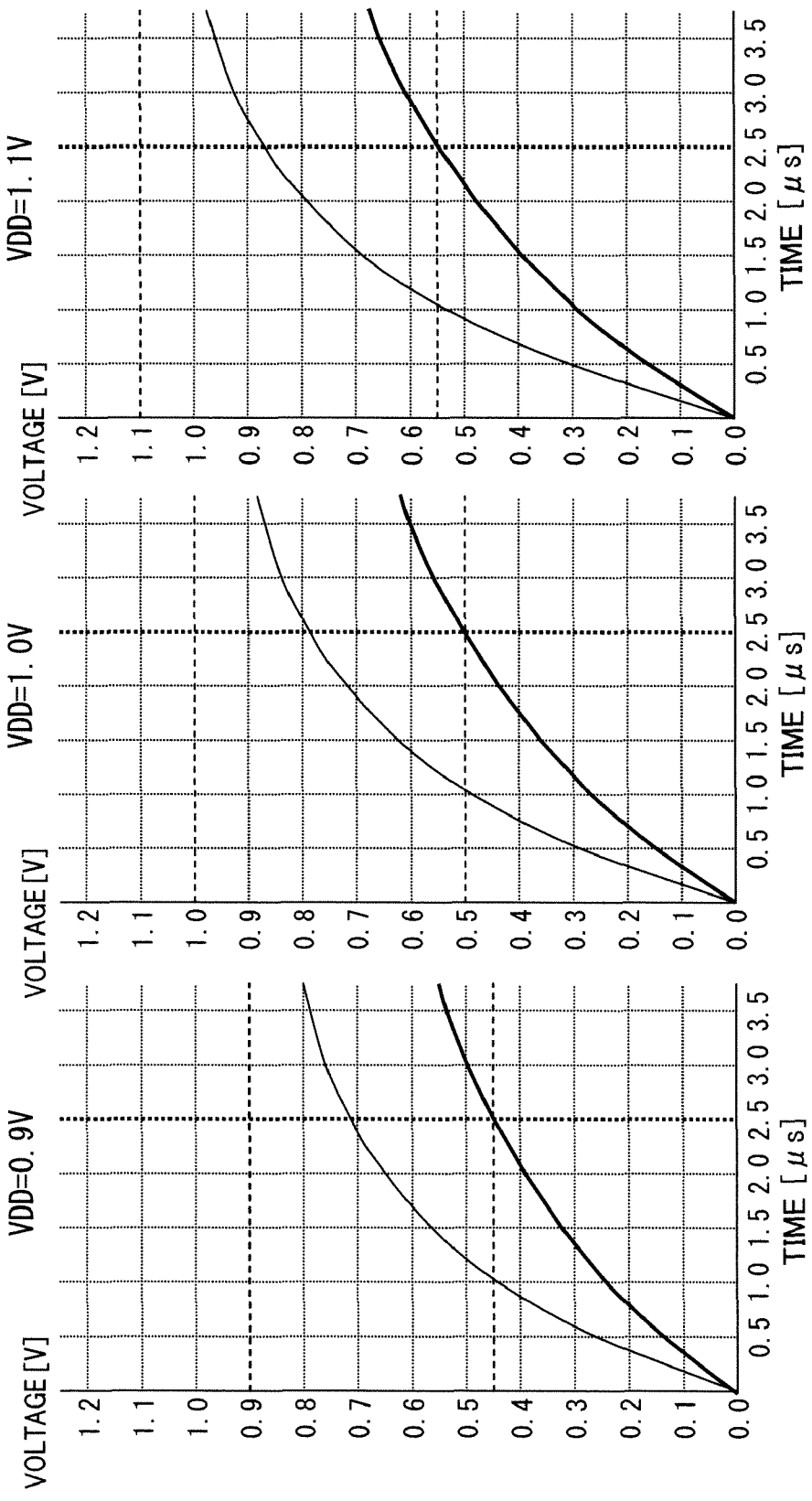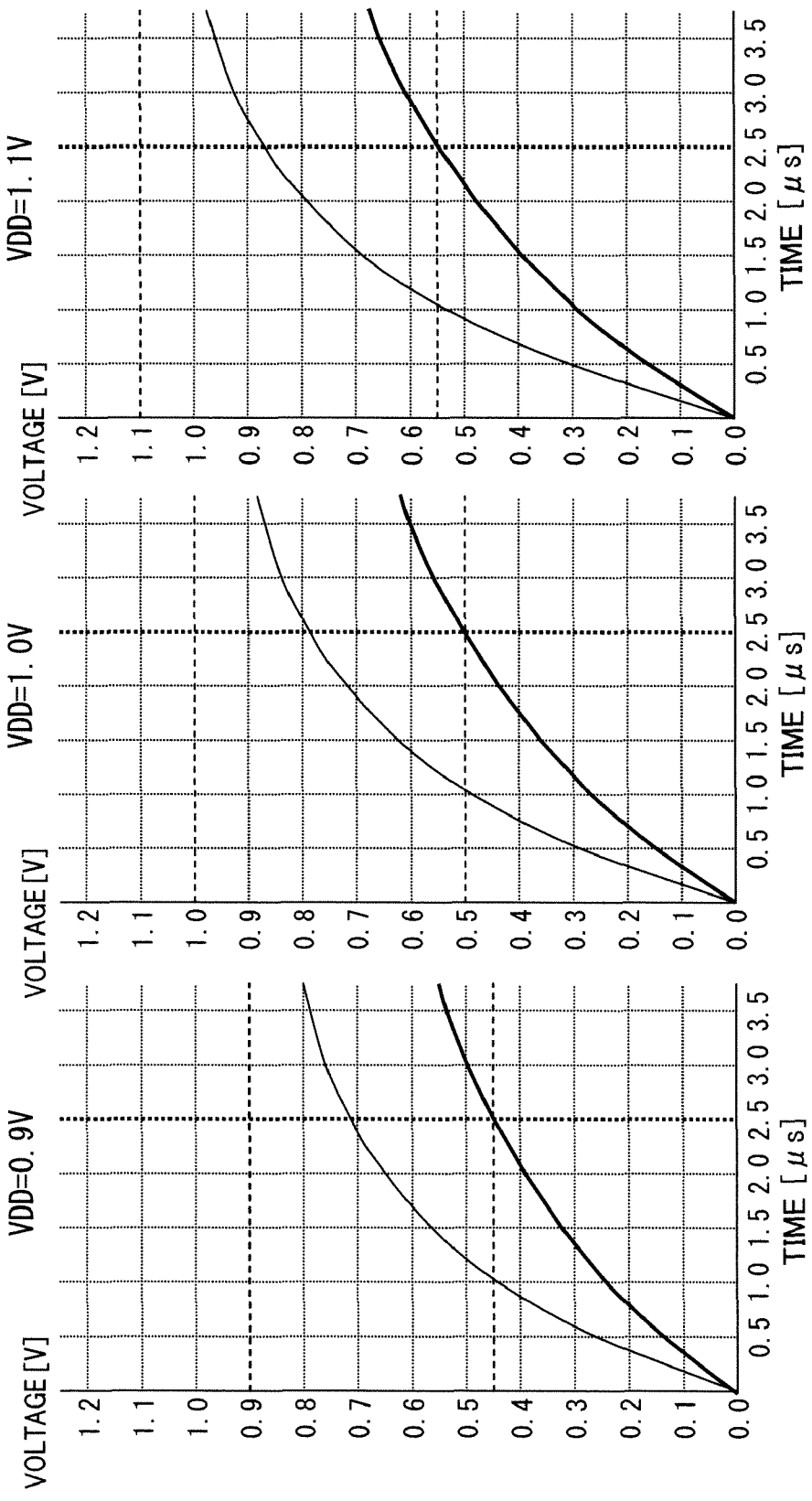

REFERENCE FREQUENCY GENERATION CIRCUIT, SEMICONDUCTOR INTEGRATED CIRCUIT, AND ELECTRONIC DEVICE

CROSS-REFERENCE TO RELATED APPLICATION

This is a continuation of PCT International Application PCT/JP2009/001270 filed on Mar. 23, 2009, which claims priority to Japanese Patent Application No. 2008-204721 filed on Aug. 7, 2008, and Japanese Patent Application No. 2009-018331 filed on Jan. 29, 2009. The disclosures of these applications including the specifications, the drawings, and the claims are hereby incorporated by reference in their entirety.

BACKGROUND

The present disclosure relates to a reference frequency generation circuit which generates a reference clock, and more particularly, relates to oscillation control in the reference frequency generation circuit.

Conventionally, a clock generation circuit such as a PLL and a DLL generates a clock having a desired frequency based on a reference frequency. As examples of such circuits for generating a reference frequency, RC oscillators each including a resistor and a capacitor, and IC oscillators each including a current source and a capacitor have been known. Such oscillators (reference frequency generation circuits) can be largely divided into the single-type oscillators, such as the oscillators disclosed in, e.g., Japanese Patent Publication No. H09-107273, Japanese Patent Publication No. H09-312552, etc., and the differential-type oscillators, such as the oscillators disclosed in, e.g., Japanese Patent Publication No. H06-77781, Japanese Patent Publication No. H10-70440, etc.

FIG. 24A is a diagram illustrating a configuration of a conventional single-type reference frequency generation circuit disclosed in H09-107273. In this circuit, an oscillator circuit 81 charges/discharges a capacitor C to output an oscillation signal OSC. An oscillation control circuit 82 outputs a reference clock CK to control the charging/discharging operation of the oscillator circuit 81.

As shown in FIG. 24B, when a signal level of the oscillation signal OSC has reached a predetermined voltage VH, the reference clock CK transitions from the low level to the high level. Thus, the capacitor C is discharged, and the signal level of the oscillation signal OSC is reduced. After a predetermined time has elapsed, the reference clock CK transitions from the high level to the low level. Thus, the capacitor C is charged, and the signal level of the oscillation signal OSC is increased. In the above-described manner, the reference flock CK having a frequency corresponding to a time constant of the oscillator circuit 81 is generated.

FIG. 25A is a diagram illustrating a configuration of a conventional differential-type reference frequency generation circuit disclosed in Japanese Patent Publication No. H06-77781. In this circuit, an oscillator circuit 91 charges/discharges capacitors C1 and C2 to output oscillation signals OSC1 and OSC2. An oscillation control circuit 92 outputs reference clocks CK1 and CK2 to control the charging/discharging operation of the oscillator circuit 91.

As shown in FIG. 25B, when a signal level of the oscillation signal OSC1 has reached a threshold voltage VT1 of an inverter 901, the reference clock CK1 transitions from the low level to the high level, and the reference clock CK2 transitions from the high level to the low level. Thus, the capacitor C1 is discharged, and the signal level of the oscillation signal OSC1 is reduced, while the capacitor C2 is charged, and a signal level of the oscillation signal OSC2 is increased. Next, when the signal level of the oscillation signal OSC2 has reached a threshold voltage VT2 of an inverter 902, the reference clock CK1 transitions from the high level to the low level, and the reference clock CK2 transitions from the low level to the high level. Thus, the capacitor C1 is charged, and the signal level of oscillation signal OSC1 is increased, while the capacitor C2 is discharged, and the signal level of the oscillation signal OSC2 is reduced. In the above-described manner, the reference clocks CK1 and CK2, each having a frequency corresponding to a time constant of the oscillator circuit 91.

SUMMARY

However, in the conventional differential-type reference frequency generation circuit, each element of the oscillation control circuit 92 has a delay time. Thus, after a response time $\Delta t$ of the oscillation control circuit 92 has elapsed since the signal level of the oscillation signal OSC1 (or OSC2) reached a predetermined voltage, the signal levels of the reference clocks CK1 and CK2 transition. Thus, the frequencies of the reference clocks CK1 and CK2 fluctuate not only due to a transient time Tic (a time for the signal level of the oscillation signal to the predetermined voltage) but also due to a delay time (the response time $\Delta t$).

Furthermore, in the conventional single-type reference frequency generation circuit, to cause, after completing discharge of the capacitor C, the signal level of the reference clock CK to return to the signal level before the transition and restart charging of the capacitor C, a reset time $\Delta T$ has to be determined. Thus, the frequency of the reference clock CK fluctuates not only due to the transient time Tic, but also due to the delay time (the response time $\Delta t$ and the reset time $\Delta T$).

The delay time is not constant but varies according to changes in a peripheral environment (e.g., changes in temperature, fluctuations in power supply voltage, etc.). Therefore, it has been very difficult to stabilize the frequency of the reference clock. Also, as the frequency of the reference clock increases, the ratio of the delay time to the transient time increases. Accordingly, the frequency of the reference clock markedly fluctuates. To reduce such influences of the delay time, a power supply amount of the oscillation control circuit has to be increased to reduce the response time of the oscillation control circuit, and therefore, the power consumption of the reference frequency generation circuit increases, as the frequency of the reference clock increases.

The techniques disclosed by the present disclosure may allow reduction in fluctuations of a frequency of a reference clock due to fluctuations of a delay time in a reference frequency generation circuit.

According to one aspect of the present disclosure, a reference frequency generation circuit which generates a reference clock includes: an oscillator circuit configured to alternately perform, in response to a transition of a signal level of the reference clock, an operation to increase a signal level of a first oscillation signal and reduce a signal level of a second oscillation signal, and an operation to increase the signal level of the second oscillation signal and reduce the signal level of the first oscillation signal; an oscillation control circuit configured to cause, when detecting that the signal level of the first oscillation signal has reached a comparison voltage, the signal level of the reference clock to transition to a first logic level, and cause, when detecting that the signal level of the second oscillation signal has reached the comparison voltage, the signal level of the reference clock to transition to a second logic level; and a reference control circuit configured to increase or reduce the comparison voltage so that a difference between a signal level of an intermediate signal which is proportional to respective swings of the first and second oscillation signals and a reference voltage is reduced.

In the reference frequency generation circuit, fluctuations in the frequency of the reference clock due to fluctuations in delay time can be reduced by performing feedback control so that each of the respective swings of the first and the second oscillation signals is constant. Thus, the frequency of the reference clock can be increased while increase in power consumption can be reduced. Furthermore, since noise components in lower bands than the loop band are attenuated by performing feedback control, low frequency noise in the reference frequency generation circuit can be reduced. Thus, the resonance characteristic (Q factor) of the reference frequency generation circuit can be improved, and variations in the frequency of the reference clock can be reduced.

According to another aspect of the present disclosure, a reference frequency generation circuit which generates a reference clock includes: an oscillator circuit configured to alternately perform, in response to a transition of a signal level of the reference clock, an operation to increase a signal level of an oscillation signal, and an operation to reduce the signal level of the oscillation signal; an oscillation control circuit configured to cause, when detecting that the signal level of the oscillation signal has reached a comparison voltage, the signal level of the reference clock to transition to a first logic level, and causes, after a predetermined time has elapsed, the signal level of the reference clock to transition to a second logic level; and a reference control circuit configured to increase or reduce the comparison voltage so that a difference between a signal level of an intermediate signal which is proportional to a swing of the oscillation signal and a reference voltage is reduced.

In the reference frequency generation circuit, fluctuations in the frequency of the reference clock due to fluctuations in delay time can be reduced by performing feedback control so that the swing of the oscillation signal is constant. Thus, the frequency of the reference clock can be increased while increase in power consumption can be reduced, as compared to the conventional single-type reference frequency generation circuit. Moreover, variations in the frequency of the reference clock can be reduced.

BRIEF DESCRIPTION OF THE DRAWINGS

FIGS. 7A 7B and 7C are graphs each of which shows a waveform of an oscillation signal and a waveform of cumulative averaged voltage for the oscillation signal in the reference frequency generation circuit of FIG. 5.

DETAILED DESCRIPTION

Figure 1:
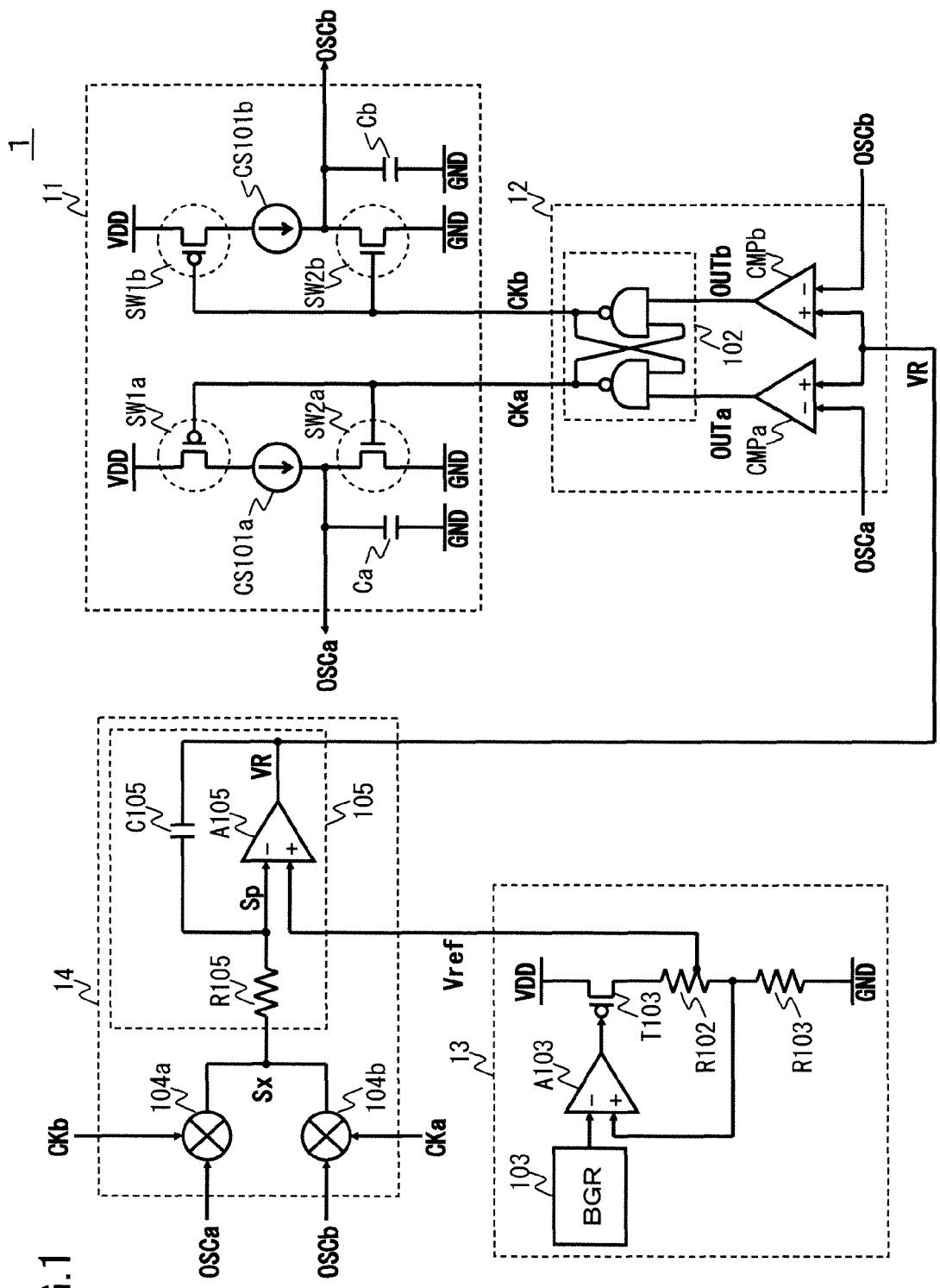
FIG. 1 is a diagram illustrating an example configuration of a reference frequency generation circuit according to a first embodiment.

Embodiments of the present disclosure will be described below in detail with reference to the accompanying drawings. Note that similar reference characters designate the same or similar elements in the drawings, and the explanation thereof is not repeated.

First Embodiment

FIG. 1 is a diagram illustrating a reference frequency generation circuit 1 according to a first embodiment. The circuit 1 is configured to generate reference clocks CKa and CKb, and includes an oscillator circuit 11, an oscillation control circuit 12, a reference voltage generation circuit 13, and a reference control circuit 14. Each of the reference clocks CKa and CKb has a frequency corresponding to a time constant of the oscillator circuit 11, and the signal levels of the reference clocks CKa and CKb change in a complementary manner.

[Oscillator Circuit and Oscillation Control Circuit]

The oscillator circuit 11 increases or decreases the signal levels of oscillation signals OSCa and OSCb in a complementary manner in response to transitions of the signal levels of the reference clocks CKa and CKb. The oscillator circuit 11 includes capacitors Ca and Cb configured to respectively generate the oscillation signals OSCa and OSCb, constant current sources CS101a and CS101b configured to supply constant currents, and switches SW1a, SW2a, SW1b, and SW2b (connection switching section) configured to switch connection states of the capacitors Ca and Cb. When detecting that the signal level of the oscillation signal OSCa (or the signal level of the oscillation signal OSCb) has exceeded a comparison voltage VR, the oscillation control circuit 12 causes the signal levels of the reference clocks CKa and CKb to transition. The oscillation control circuit 12 includes a comparator CMPa configured to compare the comparison voltage VR to the signal level of the oscillation signal OSCa, a comparator CMPb configured to compare the comparison voltage VR to the signal level of the oscillation signal OSCb, and an RS latch circuit 102 configured to receive output signals OUTa and OUTb of the comparators CMPa and CMPb and output the reference clocks CKa and CKb.

[Oscillation Operation]

Figure 2:
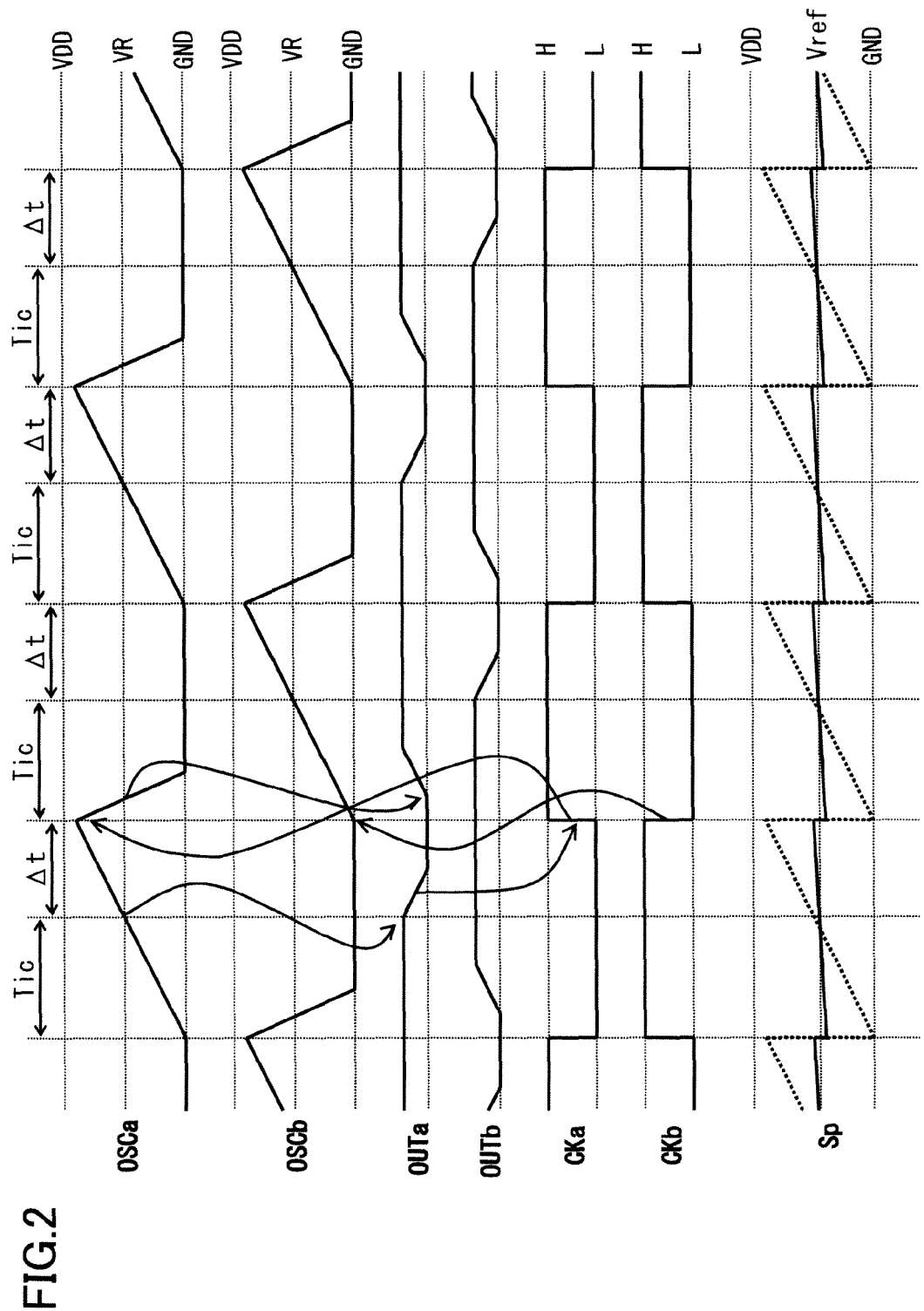
FIG. 2 is a timing chart describing an oscillation operation by the reference frequency generation circuit of FIG. 1.

Here, an oscillation operation by the oscillator circuit 11 and the oscillation control circuit 12 of FIG. 1 will be described with reference to FIG. 2.

When the signal level of the oscillation signal OSCa has exceeded the comparison voltage VR, the comparator CMPa causes the output signal OUTa to transition from the high level to the low level. In response to the transition of the output signal OUTa, the RS latch circuit 102 causes the reference clock CKa to transition to the high level and causes the reference clock CKb to transition to the low level. In the oscillator circuit 11, in response to the transitions of the reference clocks CKa and CKb, the switches SW1a and SW2b are turned off, and the switches SW1b and SW2a are turned on, so that the capacitor Ca is discharged and the capacitor Cb is charged. Thus, the oscillator circuit 11 reduces the signal level of the oscillation signal OSCa, and increases the signal level of the oscillation signal OSCb with an IC time constant (a time constant determined based on the current value of the constant current source CS101b and the capacitance value of the capacitor Cb).

When the signal level of the oscillation signal OSCb has exceeded the comparison voltage VR, the comparator CMPb causes the output signal OUTb to transition from the high level to the low level, and the RS latch circuit 102 causes the reference clocks CKa and CKb to transition respectively to the low level and the high level. In the oscillator circuit 11, in response to the transitions of the reference clocks CKa and CKb, the switches SW1a and SW2b are turned on, and the switches SW1b and SW2a are turned of so that the capacitor Ca is charged and the capacitor Cb is discharged. Thus, the oscillator circuit 11 increases the signal level of the oscillation signal OSCa with an IC time constant (a time constant determined based on the current value of the constant current source CS101a and the capacitance value of the capacitor Ca), and reduces the signal level of the oscillation signal OSCb.

[Reference Voltage Generation Circuit]

Returning to FIG. 1, the reference voltage generation circuit 13 generates, as a reference voltage Vref, a constant voltage with a predetermined potential difference between the constant voltage and the ground voltage GND. The reference voltage generation circuit 13 includes a bandgap reference circuit (BGR) 103, and a constant voltage circuit (including a pMOS transistor T103, resistors R102 and R103, and a differential amplifier circuit A103).

[Reference Control Circuit]

The reference control circuit 14 increases or reduces the comparison voltage VR so that a difference between the signal level of an intermediate signal Sp which is proportional to respective swings of the oscillation signals OSCa and OSCb (i.e., the cumulative averaged voltage for the time constant waveforms of the oscillation signals OSCa and OSCb in this case) and the reference voltage Vref is reduced. The reference control circuit 14 includes switches 104a and 104b (switching circuit), and an RC filter 105.

When the signal level of the reference clock CKb is at the high level, the switch 104a is turned on to cause the oscillation signal OSCa to pass therethrough. On the other hand, the signal level of the reference clock CKa is at the low level, and thus, the switch 104b is turned off to cut off the oscillation signal OSCb. When the signal level of the reference clock CKb is at the low level, the switch 104a is turned off to cut off the oscillation signal OSCa. On the other hand, the signal level of the reference clock CKa is at the high level, and thus, the switch 104b is turned on to cause the oscillation signal OSCb to pass therethrough. In the above-described manner, in response to the transitions of the reference clocks CKa and CKb, the oscillation signals OSCa and OSCb are caused to alternately pass, thereby supplying time constant waveform components (i.e., waveform components which increase with the time constant of the oscillator circuit 11) of each of the reference clocks CKa and CKb to the RC filter 105.

The RC filter 105 has a function of extracting, from the oscillation signals OSCa and OSCb which have passed through the switches 104a and 104b, the intermediate signal Sp which is proportional to the swings of the oscillation signals (a signal-extracting function), and a function of outputting the comparison voltage VR corresponding to a difference between the signal level of the intermediate signal Sp and the signal level of the reference voltage Vref (a difference-outputting function). For example, the RC filter 105 includes a resistor R105, a capacitor C105, and a differential amplifier circuit A105. That is, the RC filter 105 is configured by an integration circuit having both of the signal-extracting function and the difference-outputting function.

[Feedback Control]

Figure 3:
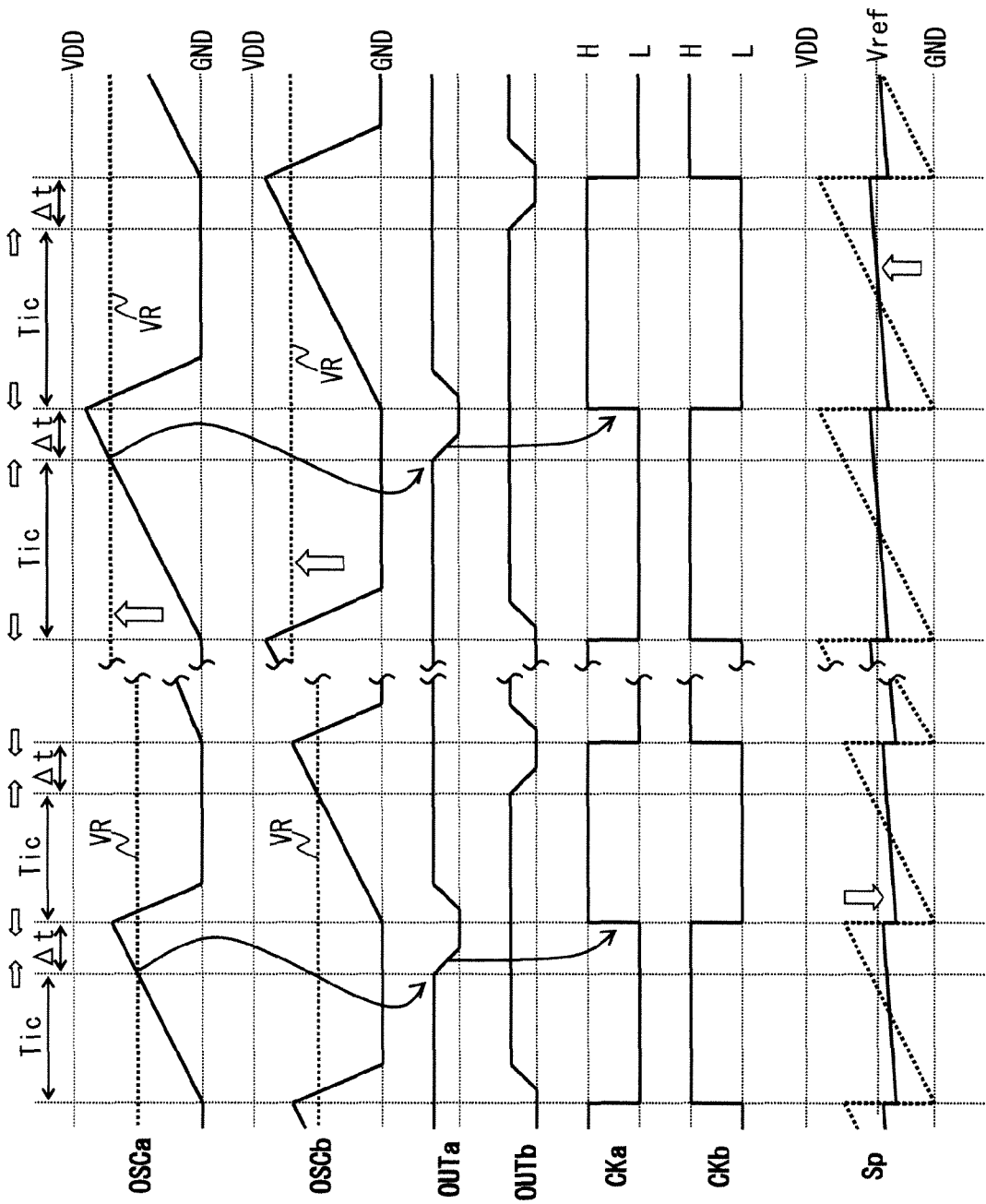
FIG. 3 is a timing chart describing a feedback control by the reference frequency generation circuit of FIG. 1.

Next, the feedback control by the reference control circuit 14 of FIG. 1 will be described with reference to FIG. 3.

When a response time Δt of the oscillation control circuit 12 (a delay time from a time when the signal level of the oscillation signal (OSCa or OSCb) has reached to the comparison voltage VR to a time when the signal level of the reference clock (CKa or CKb) has transitioned) is reduced, a cycle of the reference clock (CKa or CKb) is reduced. Also, an increasing period of the signal level of the reference clock (CKa or CKb) (i.e., a charging period of the capacitor (Ca or Cb)) is reduced, and thus, the maximum amplitude of the oscillation signal (OSCa or OSCb) is reduced. As a result, the signal level of the intermediate signal Sp has fallen below the comparison voltage VR, and therefore, the reference control circuit 14 increases the comparison voltage VR. Thus, a transient time Tic (a time from a time when the signal level of the reference clock (CKa or CKb) has transitioned to a time when the signal level of the oscillation signal (OSCa or OSCb) has reached the comparison voltage VR) is increased, so that the cycle of the reference clock (CKa or CKb) is increased. Also, the increasing period of the signal level of the oscillation signal (OSCa or OSCb) is increased, the maximum amplitude of the oscillation signal (OSCa or OSCb) is increased, and the difference between the signal level of the intermediate signal Sp and the comparison voltage VR is reduced.

Conversely, when the response time Δt of the oscillation control circuit 12 is increased, the cycle of the reference clock (CKa or CKb) is increased. Also, the increasing period of the signal level of the oscillation signal (OSCa or OSCb) is increased and, as a result, the signal level of the intermediate signal Sp has exceeded the comparison voltage VR. Therefore, the reference control circuit 14 reduces the comparison voltage VR. Thus, the transient time Tic is reduced, so that the cycle of the reference clock (CKa or CKb) is reduced.

In the above-described manner, fluctuations in the frequencies of the reference clocks CKa and CKb due to fluctuations in delay time can be reduced by performing the feedback control so that respective swings of the oscillation signals OSCa and OSCb are constant. Thus, the frequency of each of the reference clocks CKa and CKb can be increased while increase in consumption power (specifically, the power consumptions of the comparators CMPa and CMPb) can be reduced.

Furthermore, since noise components in lower bands than the loop band for the feedback control are attenuated, low frequency noise in the reference frequency generation circuit (e.g., low frequency noise of the comparison voltage VR, output noise of the comparators CMPa and CMPb, etc.) can be reduced. Thus, the resonance characteristic (Q factor) of the reference frequency generation circuit can be improved, and variations in the frequencies of the reference clocks CKa and CKb can be reduced.

The reference voltage generation circuit 13 generates the reference voltage Vref using the ground voltage GND as a reference. Thus, even when the power supply voltage VDD fluctuates, the reference voltage Vref does not fluctuate. Therefore, unnecessary fluctuations in the comparison voltage VR can be reduced and, as a result, the length of the transient time Tic is stabilized. Thus, fluctuations in the frequencies of the reference clocks CKa and CKb due to fluctuations in the power supply voltage VDD can be reduced.

(Variations of Reference Control Circuit)

Figure 4A:
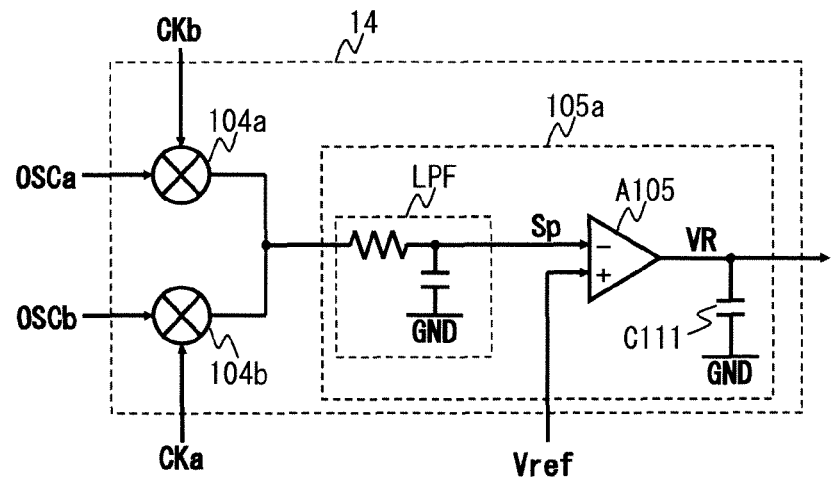
FIGS. 4A and 4B are diagrams describing variations of a reference control circuit of FIG. 1.
Figure 4B:
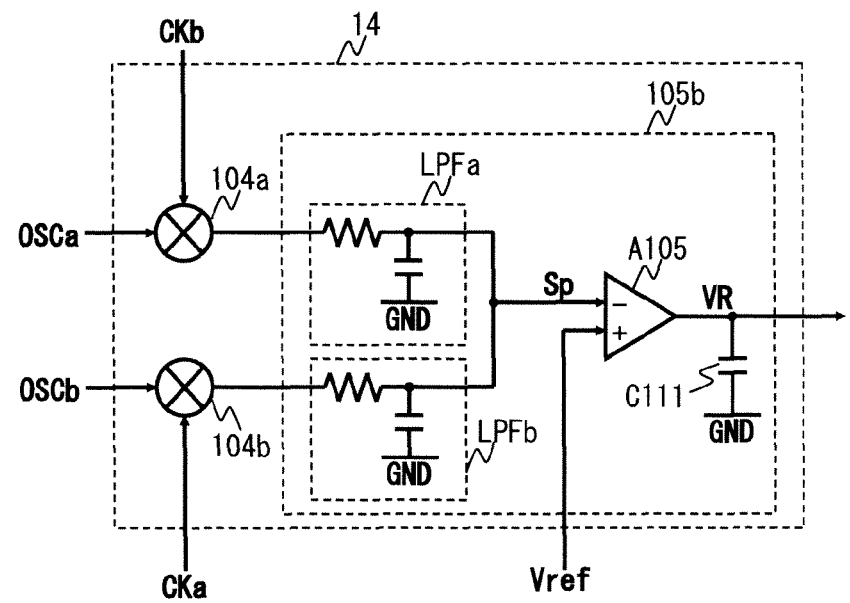

As shown in FIGS. 4A and 4B, the reference control circuit 14 may include an RC filter 105a or an RC filter 105b, instead of the RC filter 105. The RC filter 105a of FIG. 4A includes a low-pass filter LPF having the signal-extracting function, a differential amplifier circuit A105 having the difference-outputting function, and a capacitor C111 configured to smooth the comparison voltage VR from the differential amplifier circuit A105. The RC filter 105b of the FIG. 4B includes, instead of the low-pass filter LPF of FIG. 4A, low-pass filters LPFa and LPFb respectively corresponding to the switches 104a and 104b. In the RC filter 105b, an intermediate signal is extracted from each of the oscillation signals OSCa and OSCb, and then, the extracted intermediate signals are synthesized to be supplied as an intermediate signal Sp to the differential amplifier circuit A105. As described above, the reference control circuit 14 may include the RC filter 105 of FIG. 1, having integrated functions, and may include the RC filter 105a of FIG. 4A or the RC filter 105b of FIG. 4B, each having a separate function. The reference control circuit 14 may further include another circuit (e.g., an attenuator configured to attenuate the power of the oscillation signal which has passed a switch).

Second Embodiment

Figure 5:
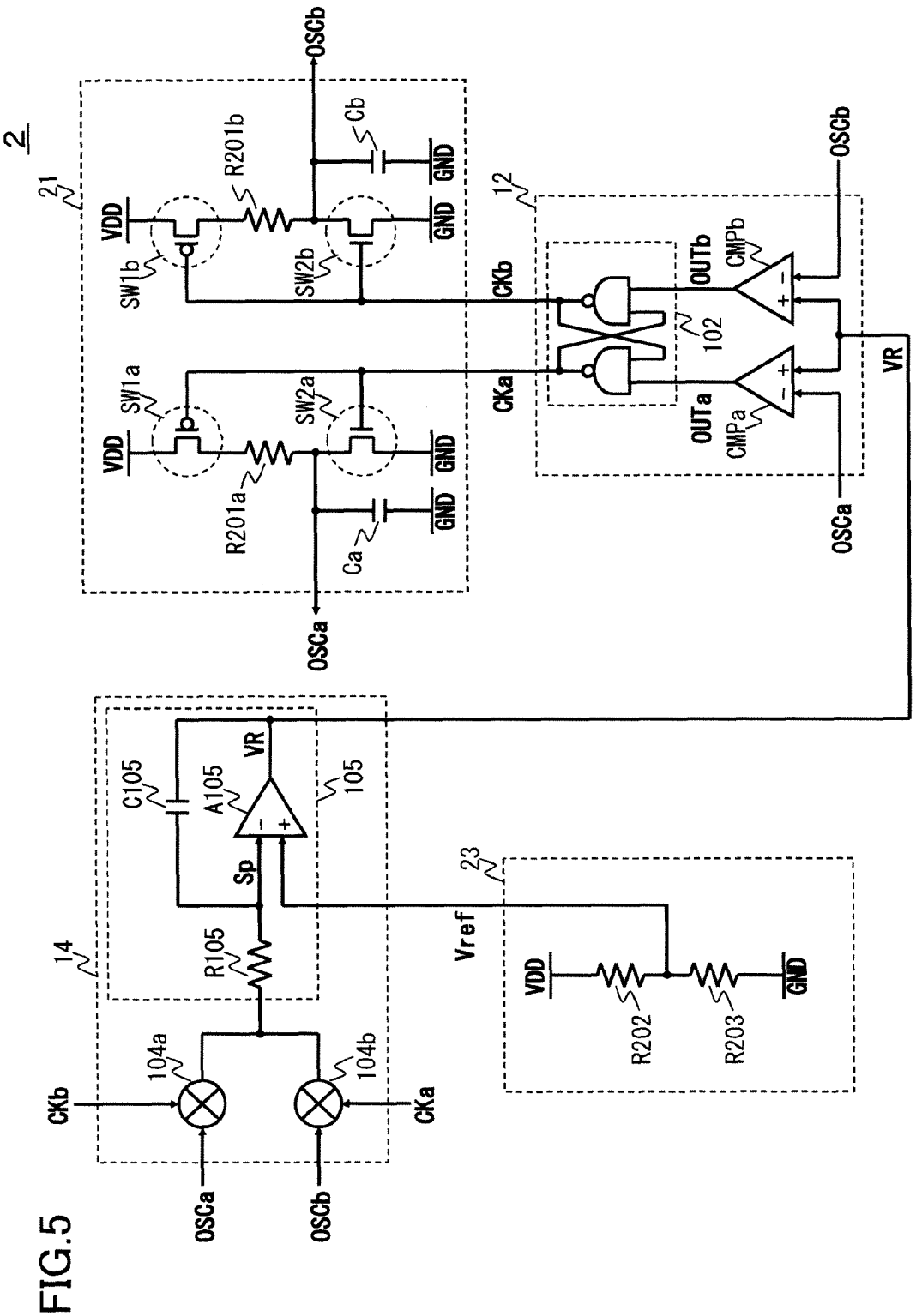
FIG. 5 is a diagram illustrating an example configuration of a reference frequency generation circuit according to a second embodiment.

FIG. 5 is a diagram illustrating an example configuration of a reference frequency generation circuit 2 according to a second embodiment. The circuit 2 includes, instead of the oscillator circuit 11 and the reference voltage generation circuit 13 of FIG. 1, an oscillator circuit 21, and a reference voltage generation circuit 23. The configurations of other components are similar to those of FIG. 1.

[Oscillator Circuit]

Figure 6:
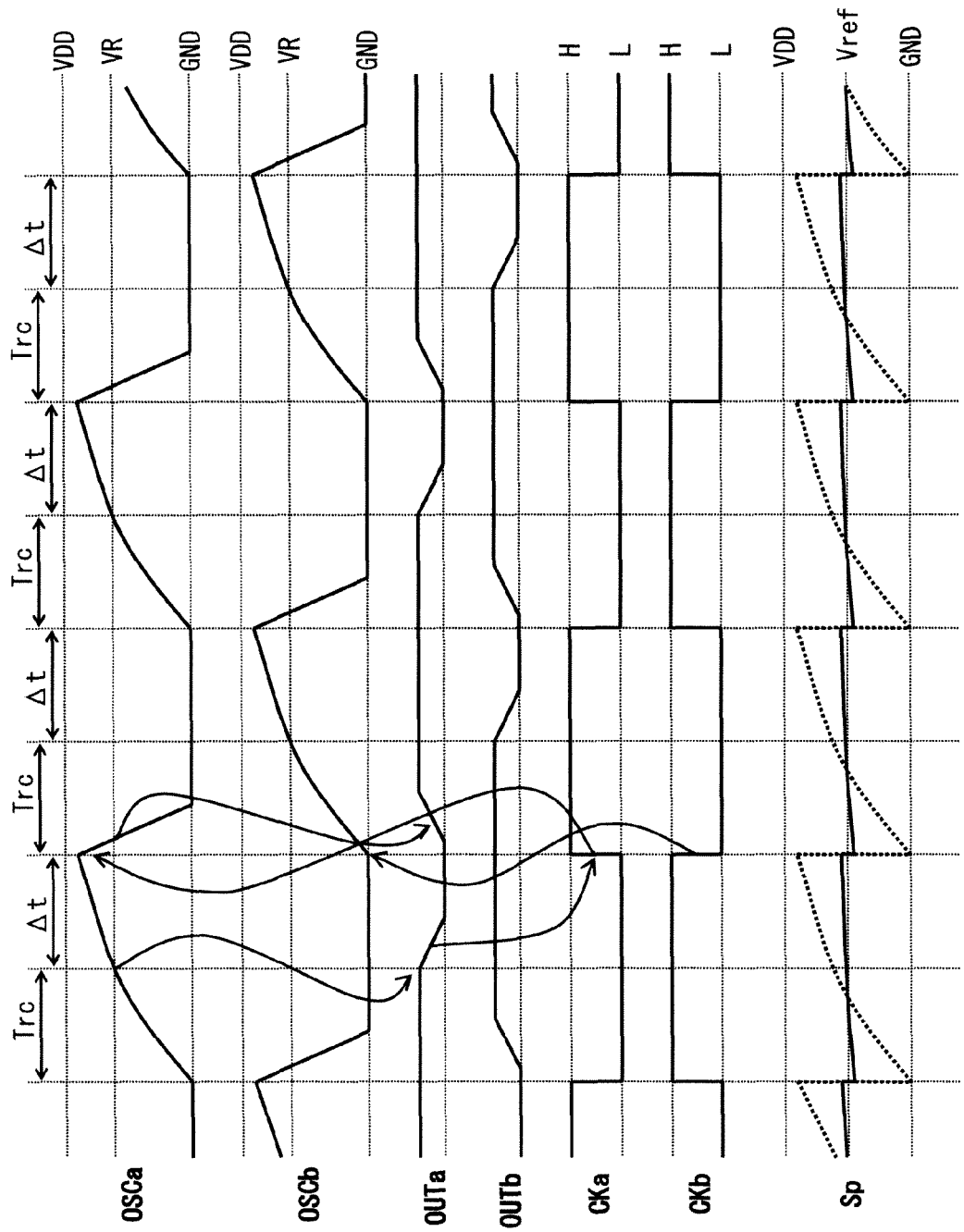
FIG. 6 is a timing chart describing an oscillation operation by the reference frequency generation circuit of FIG. 5.

The oscillator circuit 21 includes, instead of the constant current sources CS101a and CS101b of FIG. 1, resistors R201a and R201b. As shown in FIG. 6, during transient periods Trc, the oscillation signal OSCa increases with an RC time constant (a time constant determined based on the resistance value of the resistor R201a and the capacitance value of the capacitor Ca), and the oscillation signal OSCb increases with an RC time constant (a time constant determined based on the resistance value of the resistor R201b and the capacitance value of the capacitor Cb). As described above, the constant current sources CS101a and CS101b are replaced with the resistors R201a and R201b, and thus, 1/f noise (noise components which are inversely proportional to a frequency) generated at the constant current sources can be removed. Therefore, the stability of the frequencies of the reference clocks CKa and CKb can be further improved, as compared to the reference frequency generation circuit 1 of FIG. 1. Furthermore, since the resistors R201a and R201b are less susceptible to deterioration over time than the constant current sources CS101a and CS the reference frequency generation circuit 2 can accurately generate reference clocks CKa, and CKb for a long time.

[Reference Voltage Generation Circuit]

The reference voltage generation circuit 23 includes resistors 8202 and R203. The resistors R202 and R203 divide a voltage between the power supply voltage VDD and the ground voltage GND, thereby generating a reference voltage Vref.

Now, the relationship among the power supply voltage VDD, the oscillation signal OSCa, and the cumulative averaged voltage of the oscillation signal OSCa (i.e., the intermediate signal Sp) will be described. FIGS. 7A, 7B, and 7C are graphs showing time constant waveforms of the oscillation signal OSCa (indicated by the thin lines in FIGS. 7A, 7B, and 7C) and cumulative averaged voltage of the oscillation signal OSCa (indicated by the heavy lines in FIGS. 7A, 7B, and 7C) when the power supply voltage VDD is 0.9 V, 1.0 V, and 1.1 V. As shown in FIGS. 7A, 7B, and 7C, the rate of increase of the signal level of the oscillation signal OSCa increases with increase in the power supply voltage VDD. Therefore, when the reference voltage Vref does not fluctuate with increase in the power supply voltage VDD, the comparison voltage VR does not fluctuate. Thus, the transient time Trc fluctuates, and the frequencies of the reference clocks CKa and CKb fluctuate. Also, even when the power supply voltage VDD fluctuates, a time for the ratio of the cumulative averaged voltage to the power supply voltage VDD to be a predetermined ratio is constant. For example, a time for the cumulative averaged voltage to be ½ of the power supply voltage VDD is 2.5 μs in any case. That is, if the comparison voltage VR is controlled so that the ratio of the intermediate signal Sp to the power supply voltage VDD is constant, the length of the transient time Trc can be maintained to be constant.

The reference voltage generation circuit 23 generates the reference voltage Vref so that the ratio of the reference voltage Vref to the power supply voltage VDD is constant. Thus, the reference control circuit 14 can control the comparison voltage VR so that the ratio of the intermediate signal Sp to the power supply voltage VDD is constant and, as a result, fluctuations in the frequencies of the reference clocks due to fluctuations of the power supply voltage VDD can be reduced.

[Analysis Using Simplified Model]

Figure 8:
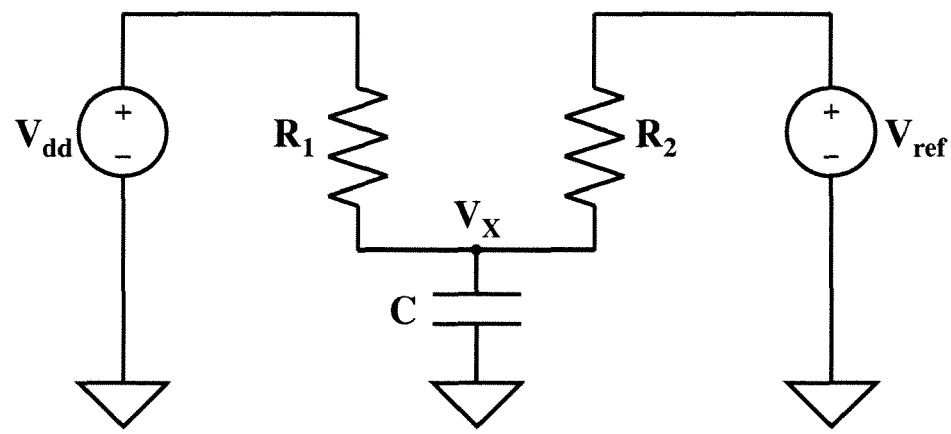
FIG. 8 is a diagram illustrating a simplified model for an oscillator circuit and a reference control circuit of FIG. 5.

Next, the relationship between the ratio of the reference voltage Vref to the power supply voltage VDD and the transient time Trc will be described. FIG. 8 is a diagram illustrating a simplified model for the oscillator circuit 21 and the reference control circuit 14 during a charging period of the capacitor Ca. In the simplified model, "C," "$R_1$," "$R_2$," "$V_{dd}$," "$V_{ref}$," and "$V_x$" correspond to the capacitor Ca, the resistor R201a, the resistor R105, the power supply voltage VDD, the reference voltage Vref, and the signal level of the oscillation signal OSCa, respectively.

In this case, assuming that the transient time Trc is "τ," the amount of charge collected at the capacitor Ca during the transient time Trc and the cumulative averaged voltage (i.e., the intermediate signal Sp) for the oscillation signal OSCa can be expressed by Equations 1 and 2, respectively.

$$CV_X(\tau) = \int_0^\tau \frac{V_{dd} - V_X(t)}{R_1} dt + \int_0^\tau \frac{V_{ref} - V_X(t)}{R_2} dt \quad \text{[Equation 1]}$$

$$\int_0^\tau V_X(t) dt = V_{ref} \tau \quad \text{[Equation 2]}$$

If $1/(CR_1)=\omega_1$ and $1/(CR_2)=\omega_2$, Equation 3 is obtained based on Equation 1.

$$\int_0^\tau V_X(t) dt = \frac{1}{\omega_1 + \omega_2}(\omega_1 V_{dd} + \omega_2 V_{ref})\tau - \frac{1}{\omega_1 + \omega_2} V_X(\tau) \quad \text{[Equation 3]}$$

If Equation 2 is substituted into Equation 3, Equation 4 is obtained.

$$V_X(\tau) = \omega_1(V_{dd} - V_{ref})\tau \quad \text{[Equation 4]}$$

Also, $V_x(\tau)$ can be expressed by Equation 5.

$$V_X(\tau) = \left(V_{ref} + (V_{dd} - V_{ref})\frac{R_2}{R_1 + R_2}\right)(1 - \exp(-(\omega_1 + \omega_2)\tau)) \quad \text{[Equation 5]}$$

Assume $V_{ref}/V_{dd}=A$. Then, if Equation 4 is substituted into Equation 5, Equation 6 is obtained.

$$\omega_1(1-A)\tau = \frac{R_1 A + R_2}{R_1 + R_2}(1 - \exp(-(\omega_1 + \omega_2)\tau)) \quad \text{[Equation 6]}$$

If $R_1$ is sufficiently smaller than $R_2$, Equation 7 is obtained based on Equation 6.

$$\omega_1(1-A)\tau = 1 - \exp(-\omega_1 \tau) \quad \text{[Equation 7]}$$

It can be seen from Equation 7 that the transient time Trc is determined by the time constant $\omega_1$ (the time constant of the oscillator circuit 21) and the ratio A (the ratio of the reference voltage Vref to the power supply voltage VDD). That is, the transient time Trc can be set to be a time length corresponding to the time constant $\omega_1$ by maintaining the ratio of the reference voltage Vref to the power supply voltage VDD to be constant.

[Sensitivity Analysis Using Simplified Model]

Figure 9:
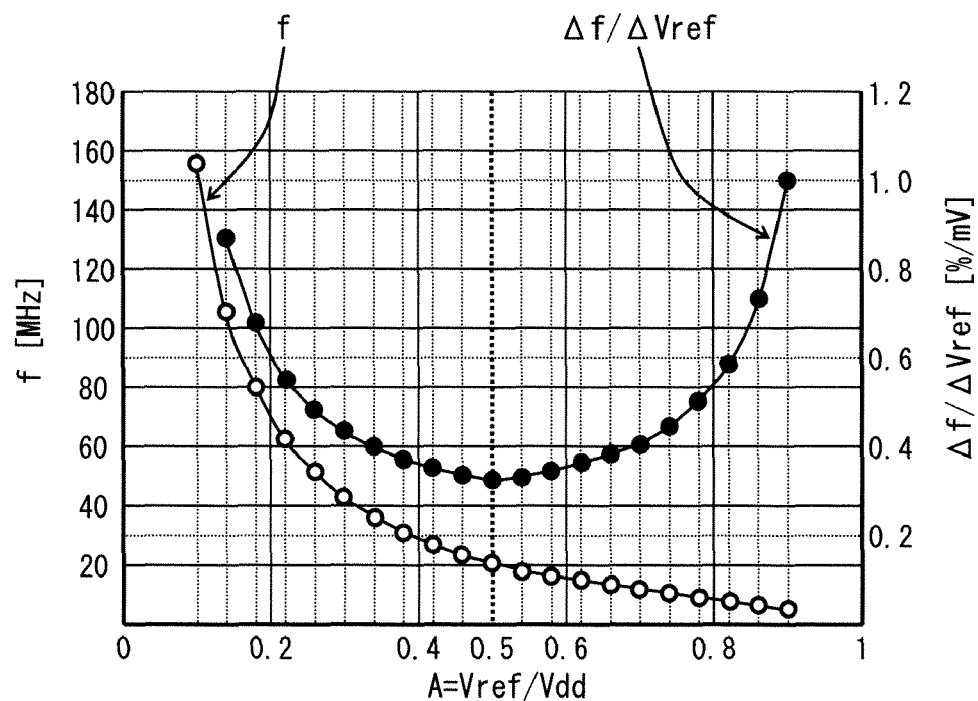
FIG. 9 is a graph showing results of sensitivity analysis using the simplified model of FIG. 8.

Next, a sensitivity analysis of the reference frequency generation circuit 2 will be described with reference to FIG. 9. In this case, assuming that C=0.2 pF, $R_1$=75 kΩ, $R_2$=1000 kΩ, and Vdd=1.0 V, a sensitivity analysis was performed based on Equation 6. In FIG. 9, the oscillation frequency f corresponds to "1/2τ," the ratio A corresponds to the ratio of the reference voltage Vref to the power supply voltage VDD, and the frequency fluctuation amount Δf/ΔVref corresponds to the amount of fluctuation in the oscillation frequency f when the reference voltage Vref in the ratio A is caused to fluctuate in the range of ±1 mV. The results of the analysis show that as the rate A reduces, the oscillation frequency f increases. The results also show that the frequency fluctuation amount Δf/ΔVref is small at and around the point where A=0.5. Based on the foregoing, the ratio of the reference voltage Vref to the power supply voltage VDD is preferably set to be about 0.5.

As described above, the ratio of the reference voltage Vref to the power supply voltage VDD is caused to be constant by the reference voltage generation circuit 23, and thus, the length of the transient time Trc can be maintained to be constant. Therefore, fluctuations in the frequencies of the reference clocks CKa and CKb due to fluctuations of the power supply voltage VDD can be reduced.

Note that the reference frequency generation circuit 2 of FIG. 5 may include, instead of the RC-type oscillator circuit 21, an IC-type oscillator circuit 11 of FIG. 1. Also, the reference frequency generation circuit 2 may include, instead of the reference voltage generation circuit 23, the reference voltage generation circuit 13 of FIG. 1. That is, a combination of the reference voltage generation circuit 23 and the IC-type oscillator circuit 11 may be used, and a combination of the reference voltage generation circuit 13 and the RC-type oscillator circuit 21 can be used.

Third Embodiment

Figure 10:
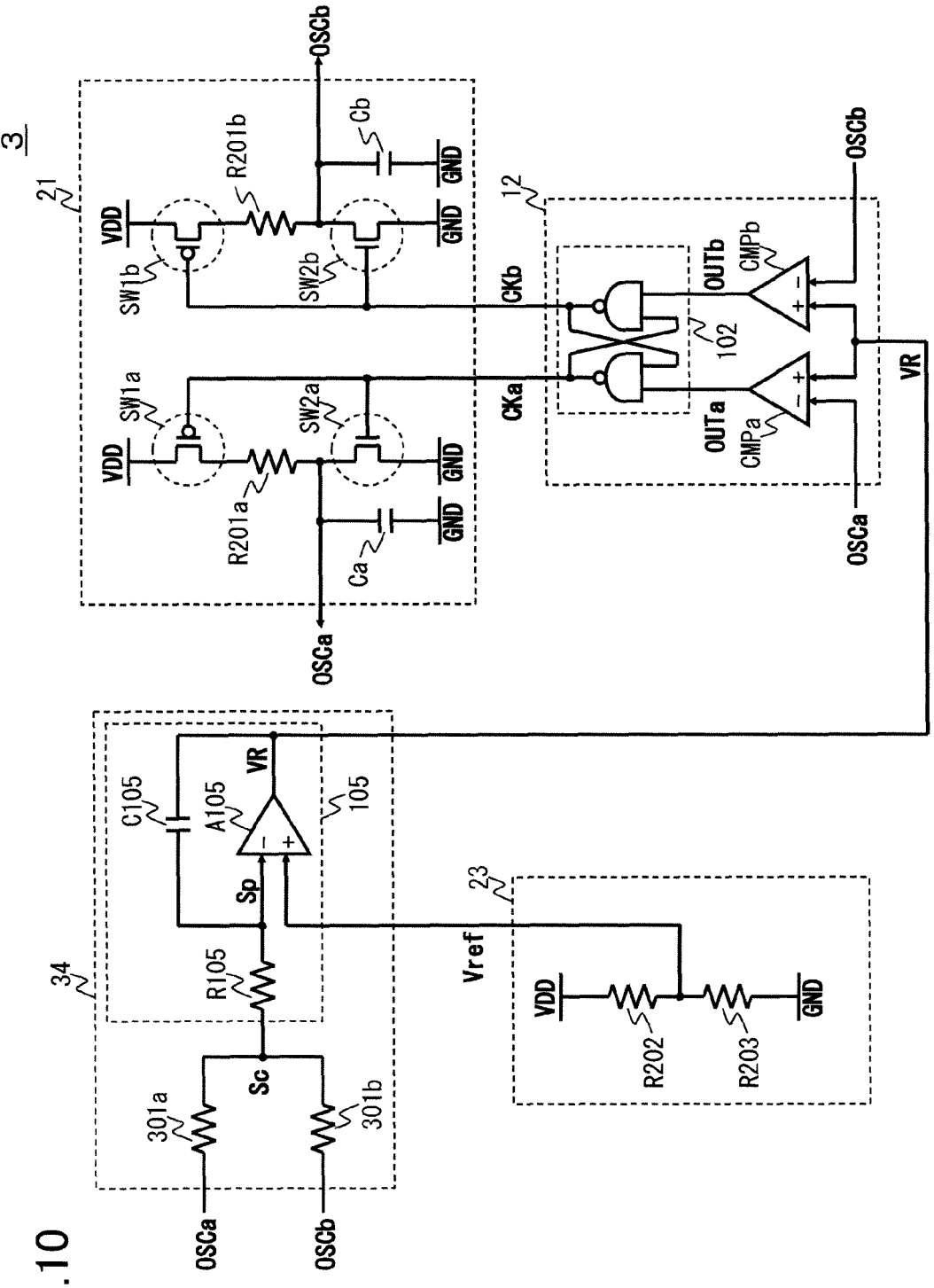
FIG. 10 is a diagram illustrating an example configuration of a reference frequency generation circuit according to a third embodiment.

FIG. 10 is a diagram illustrating an example configuration of a reference frequency generation circuit 3 according to a third embodiment. The circuit 3 includes, instead of the reference control circuit 14 of FIG. 5, a reference control circuit 34. Configurations of other components are similar to those of FIG. 5. The reference control circuit 34 includes, instead of the switches 104a and 104b of FIG. 5, resistors 301a and 301b. Each of the resistors 301a and 301b has one end connected to the RC filter 105. The oscillation signal OSCa is supplied to the other end of the resistor 301a, and the oscillation signal OSCb is supplied to the other end of the resistor 301b.

Figure 11:
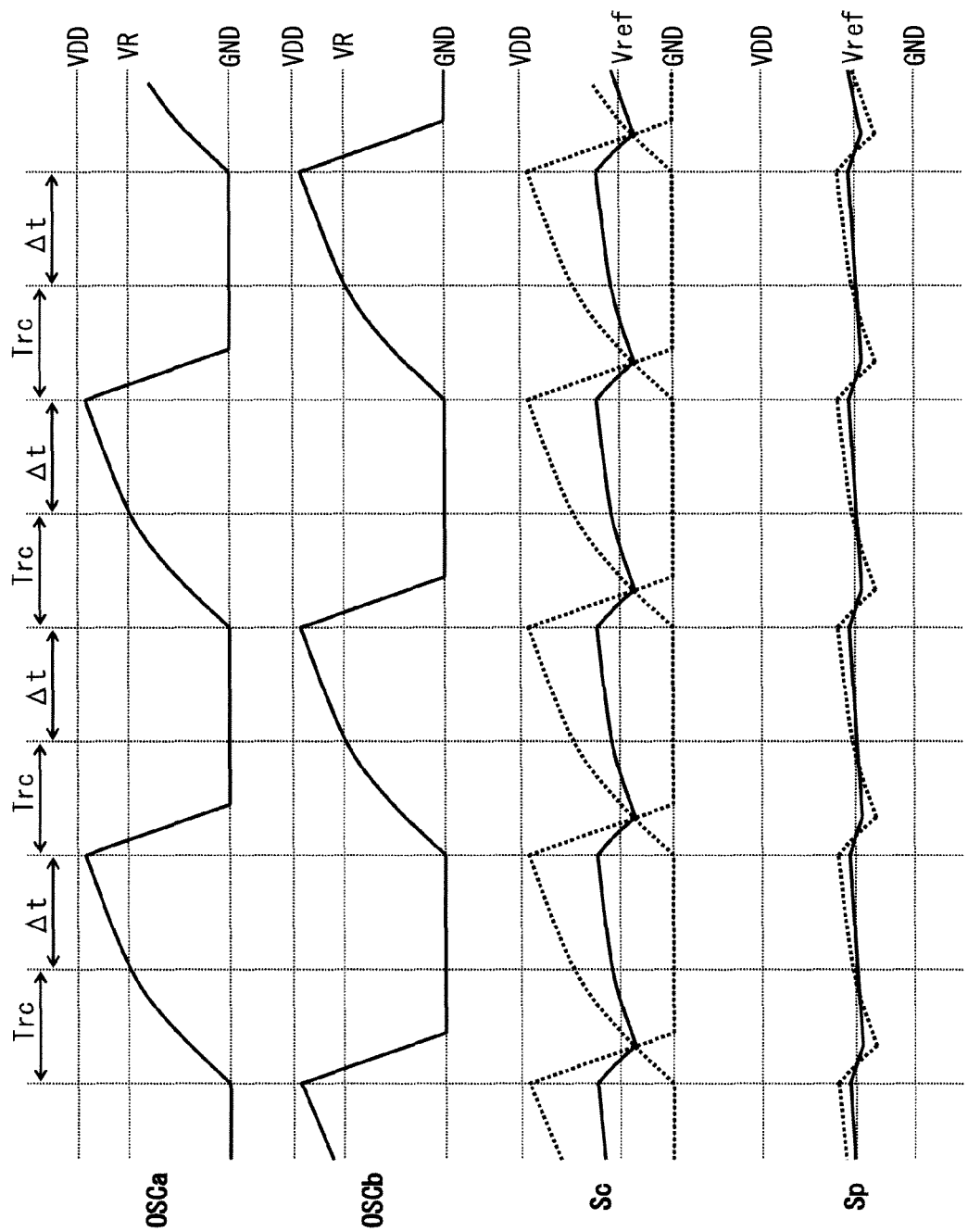
FIG. 11 is a timing chart describing an operation of the reference frequency generation circuit of FIG. 10.

As shown in FIG. 11, the oscillation signals OSCa and OSCb which have respectively passed through the resistors 301a and 301b are synthesized to generate a synthesized signal Sc. That is, the oscillation signals OSCa and OSCb are divided by the resistors 301a and 301b, thereby generating the synthesized signal Sc. The RC filter 105 extracts, from the synthesized signal Sc, an intermediate signal Sp which is proportional to the swing of the synthesized signal Sc, and outputs the comparison voltage VR corresponding to a difference between the signal level of the intermediate signal Sp (i.e., the cumulative averaged voltage of the synthesized signal Sc in this case) and the reference voltage Vref.

In the reference control circuit 14 of FIG. 5, as the power supply voltage VDD reduces, the amplitudes of the control signals (the reference clocks CKa and CKb) of the switches 104a and 104b reduce. Accordingly, on-resistance distortions of each of the switches 104a and 104b markedly occur. Thus, in the configuration of the reference frequency generation circuit 2 shown in FIG. 5, it is difficult to achieve reduction in voltage (i.e., reduction in power supply voltage). In contrast, in the reference frequency generation circuit 3 of FIG. 10, the switches 104a and 104b are replaced with the resistors 301a and 301b, and on-resistance distortions do not occur. Therefore, reduction in voltage can be achieved more easily in the reference frequency generation circuit 3 than in the reference frequency generation circuit 2 of FIG. 5.

Note that the reference frequency generation circuit 3 may include, instead of the RC-type oscillator circuit 21, the IC-type oscillator circuit 11 of FIG. 1. Also, the reference frequency generation circuit 3 may include, instead of the reference voltage generation circuit 23, the reference voltage generation circuit 13 of FIG. 1. That is, a combination of the reference control circuit 34 and the IC-type oscillator circuit 11 may be used, and a combination of the reference control circuit 34 and the reference voltage generation circuit 13 may be used.

(Variation of Reference Control Circuit)

Figure 12A:
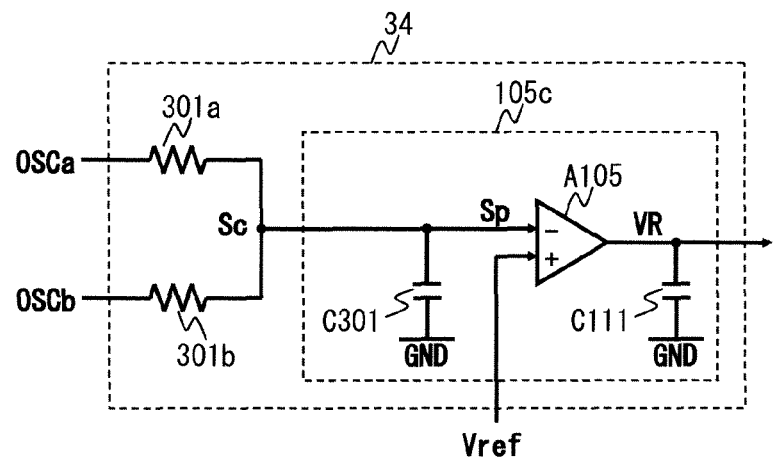
FIGS. 12A and 12B are diagrams describing variations of a reference control circuit of FIG. 10.
Figure 12B:
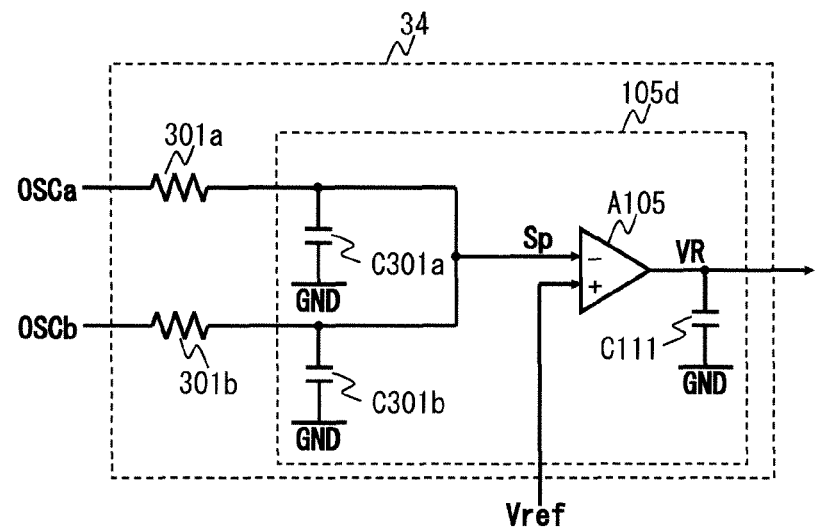

In the reference control circuit 34 of FIG. 10, the RC filter 105 does not have to include the resistor R105. Also, as shown in FIGS. 12A and 12B, the reference control circuit 34 may include, instead of the RC filter 105, an RC filter 105c or an RC filter 105d. The RC filter 105c of FIG. 12A includes the capacitor C301 having the signal-extracting function, the differential amplifier circuit A105, and the capacitor C111. The RC filter 105d of FIG. 12B includes, instead of the capacitor C301 of FIG. 12A, capacitors C301a and 301b respectively corresponding to the resistors 301a and 301b. The reference control circuit 34 may further include another circuit (e.g., an attenuator for attenuating power of each of the oscillation signals OSCa and OSCb which have passed through the resistors 301a and 301b).

Fourth Embodiment

Figure 13:
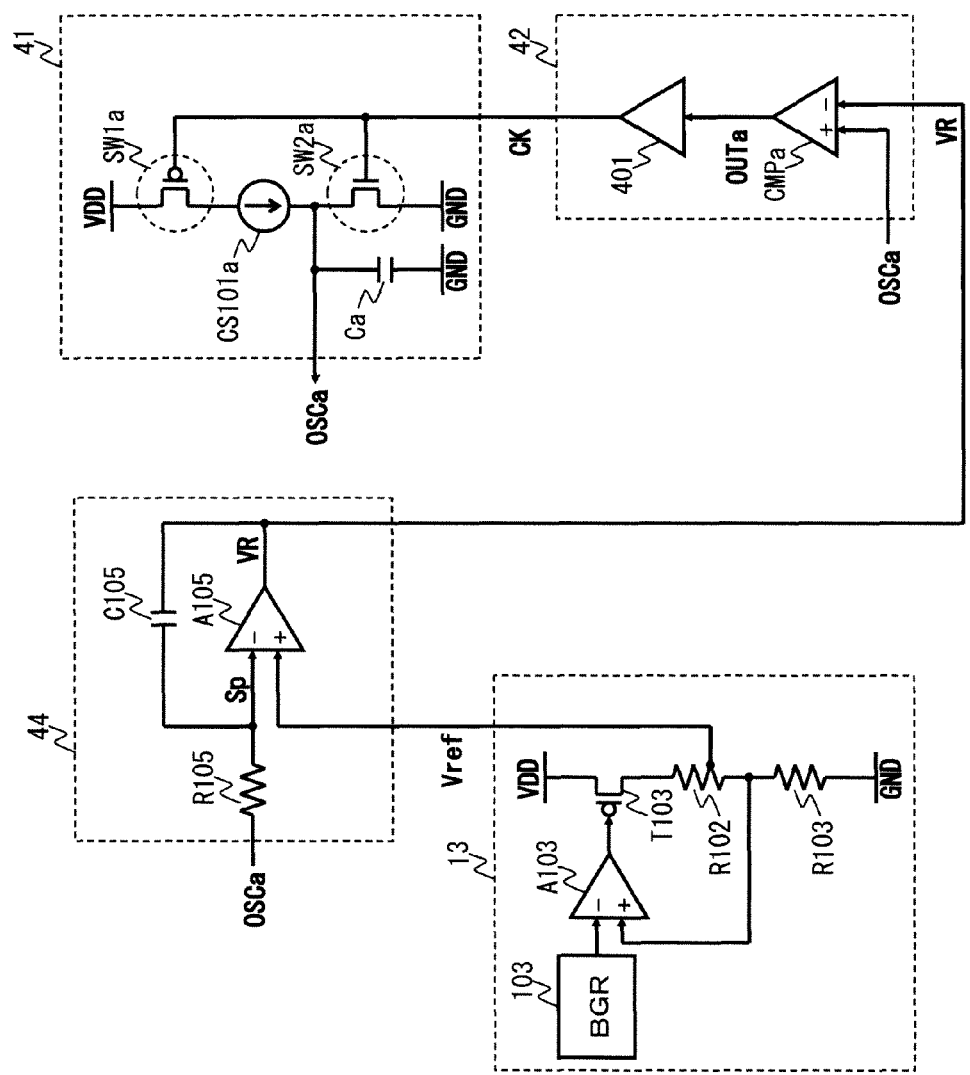
FIG. 13 is a diagram illustrating an example configuration of the reference frequency generation circuit according to a fourth embodiment.

FIG. 13 is a diagram illustrating an example configuration of a reference frequency generation circuit 4 according to a fourth embodiment. The circuit 4 includes an oscillator circuit 41, an oscillation control circuit 42, a reference control circuit 44, and the reference voltage generation circuit 13 of FIG. 1. A reference clock CK has a frequency corresponding to a time constant of the oscillator circuit 41.

[Oscillator Circuit and Oscillation Control Circuit]

The oscillator circuit 41 increases or reduces the signal level of the oscillation signal OSCa in response to a transition of the signal level of the reference clock CK. The oscillator circuit 41 includes a capacitor Ca, a constant current source CS101a, and switches SW1a and SW2a. When detecting that the signal level of the oscillation signal OSCa has exceeded a comparison voltage VR, the oscillation control circuit 42 causes the reference clock CK to transition from the low level to the high level and, after a predetermined time has elapsed, the oscillation control circuit 42 causes the reference clock CK to transition from the high level to the low level. The oscillation control circuit 42 includes a comparator CMPa and a delay circuit 401.

[Oscillation Operation]

Figure 14:
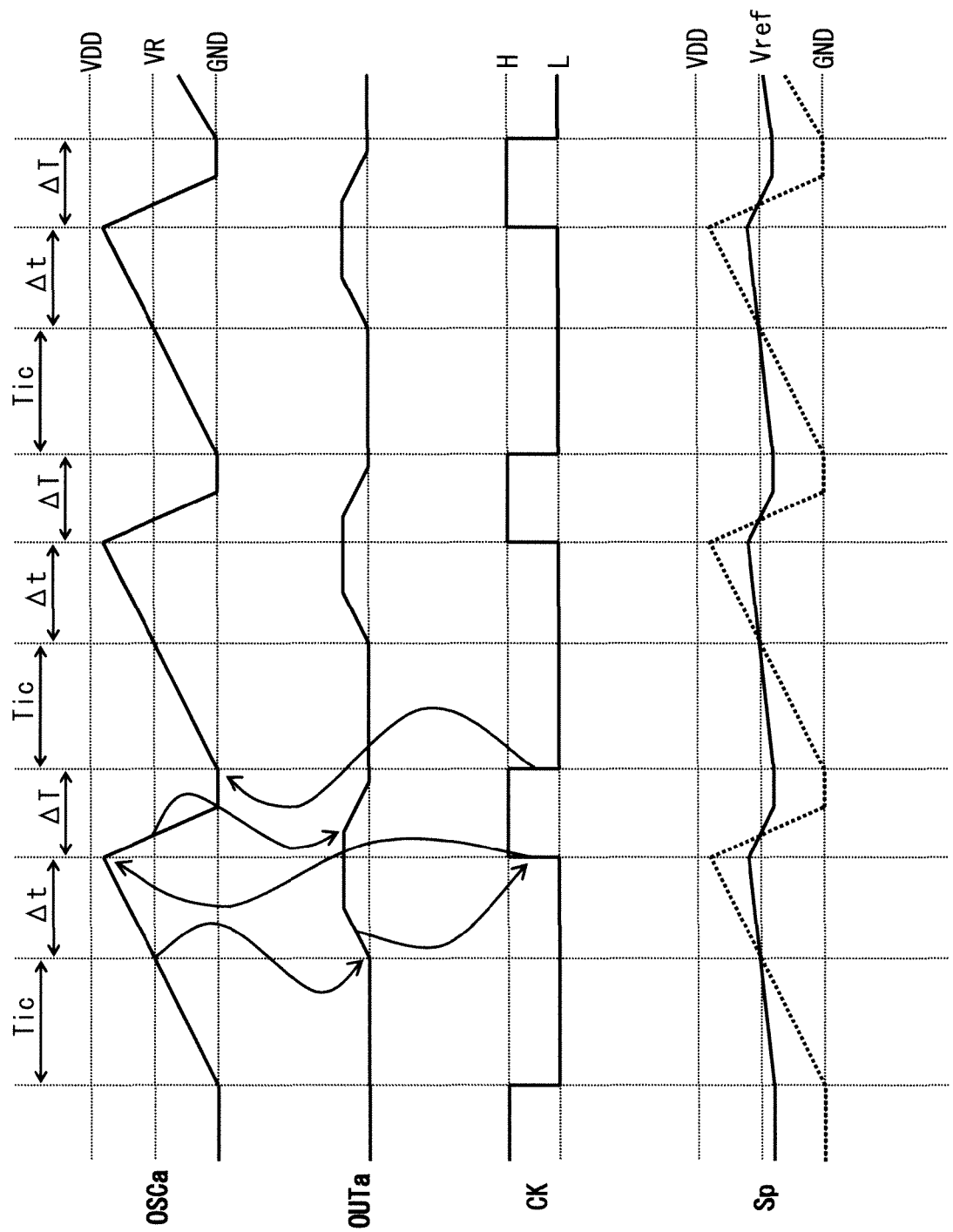
FIG. 14 is a timing chart describing an operation of the reference frequency generation circuit of FIG. 13.

Here, an oscillation operation by the oscillator circuit 41 and the oscillation control circuit 42 of FIG. 13 will be described with reference to FIG. 14. When the signal level of the oscillation signal OSCa has exceeded the comparison voltage VR, the comparator CMPa causes an output signal OUTa to transition from the low level to the high level. The delay circuit 401 delays the output signal OUTa, and outputs the resultant signal as the reference clock signal CK. In the oscillator circuit 41, the capacitor Ca is discharged in response to the transition of the reference clock CK. Thus, the oscillator circuit 41 reduces the signal level of the oscillation signal OSCa. After a reset time ΔT (a delay time of the delay circuit 401) has elapsed, the signal level of the reference clock CK transitions from the high level to the low level. In the oscillator circuit 41, the capacitor Ca is charged in response to the transition of the reference clock CK. Thus, the oscillator circuit 41 increases the signal level of the oscillation signal OSCa with an IC time constant (a time constant determined based on a current amount of the constant current source CS101a and a capacitance value of the capacitor Ca).

[Reference Control Circuit]

Returning to FIG. 13, the reference control circuit 44 increases or reduces the comparison voltage VR so that a difference between the signal level of the intermediate signal Sp which is proportional to the swing of the oscillation signal OSCa (i.e., the cumulative averaged voltage of the oscillation signal OSCa in this case) and the reference voltage Vref is reduced. The reference control circuit 44 has a similar configuration to that of the RC filter 105 of FIG. 1.

When a response time Δt of the oscillation control circuit 42 is reduced, a cycle of the reference clock CK is reduced. The increasing period of the signal level of the oscillation signal OSCa is also reduced, and thus, a maximum amplitude of the oscillation signal OSCa is reduced. As a result, the signal level of the intermediate signal Sp has fallen below the comparison voltage VR, and therefore, the reference control circuit 44 increases the comparison voltage VR. Thus, the transient time Tic is increased, and the cycle of the reference clock CK is increased. Also, the increasing period of the signal level of the oscillation signal OSCa is increased, and the maximum amplitude of the oscillation signal OSCa is increased. Therefore, a difference between the signal level of the intermediate signal Sp and the comparison voltage VR is reduced.

Conversely, when the response time Δt of the oscillation control circuit 42 is increased, the cycle of the reference clock CK is increased. The increasing period of the signal level of the oscillation signal OSCa is also increased and, as a result, the signal level of the intermediate signal Sp has exceeded the comparison voltage VR. Therefore, the reference control circuit 44 reduces the comparison voltage VR. Thus, the transient time Tic is reduced, and therefore, the cycle of the reference clock CK is reduced.

As described above, fluctuations in the frequency of the reference clock CK due to fluctuations in delay time can be reduced by performing feedback control so that the swing of the oscillation signal OSCa is constant. Thus, the frequency of the reference clock CK can be increased while increase in power consumption of the reference frequency generation circuit can be reduced, as compared to the conventional single-type reference frequency generation circuit.

Furthermore, since noise components in lower bands than the loop band for feedback control are attenuated, low-frequency noise in the reference frequency generation circuit can be reduced. Thus, the resonance characteristic (Q factor) of the reference frequency generation circuit 4 can be improved, and variations in the frequency of the reference clock CK can be reduced.

(Initialization Circuit)

Figure 15A:
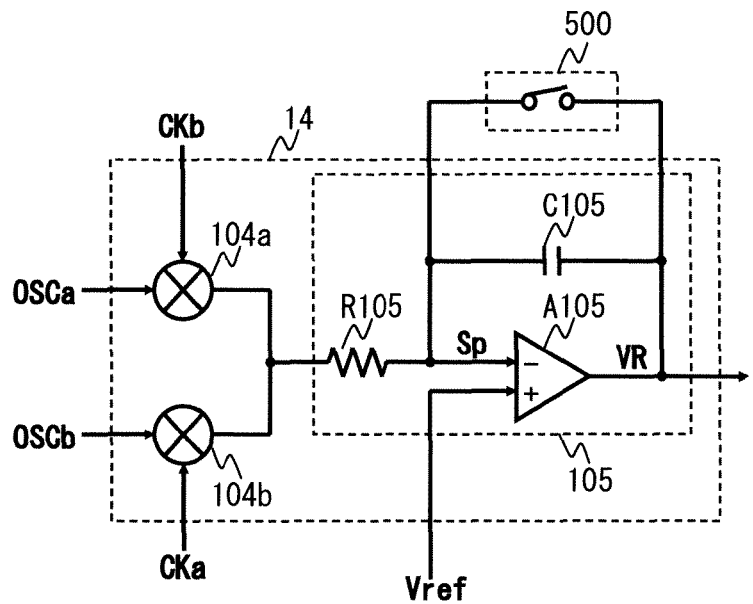
FIGS. 15A and 15B are diagrams describing initialization circuits.

Each of the reference frequency generation circuits 1, 2, 3, and 4 may further include an initialization circuit 500 of FIG. 15A. The initialization circuit 500 switches a connection between an inverting input terminal and an output terminal of the differential amplifier circuit A105 provided in the RC filter 105 in response to external control. For example, at the time when the reference frequency generation circuit is started, the initialization circuit 500 causes a short-circuit between the inverting input terminal and the output terminal of the differential amplifier circuit A105. Thus, the comparison voltage VR can be initialized to be a predetermined voltage level (i.e., the reference voltage Vref in this case). Also, after the comparison voltage VR is initialized, the initialization circuit 500 separates the inverting input terminal of the differential amplifier circuit A105 from the output terminal of the differential amplifier circuit A105. Thus, feedback control by the reference control circuit is started.

Figure 15B:
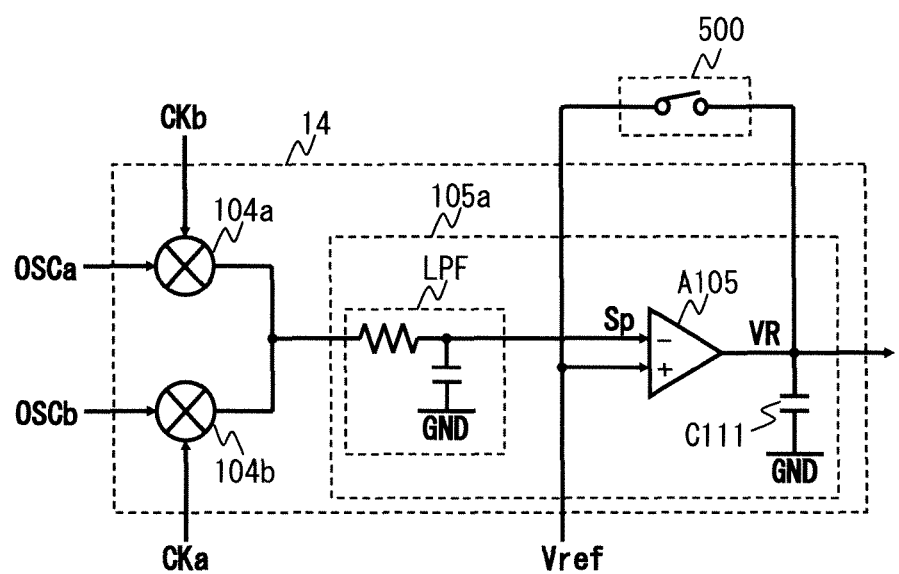

As described above, with the configuration including the initialization circuit 500, an abnormal operation of the reference frequency generation circuit due to an abnormal initial value of the comparison voltage VR can be avoided. Also, the time required for the frequency of the reference clock to be stabilized can be reduced. Note that, as shown in FIG. 15B, the initialization circuit 500 is applicable not only to the RC filter 105, having integrated functions, but also to the RC filters 105a, 105b, 105c, and 105d, each having a separate function.

(Variations of RC Filter)

Figure 16:
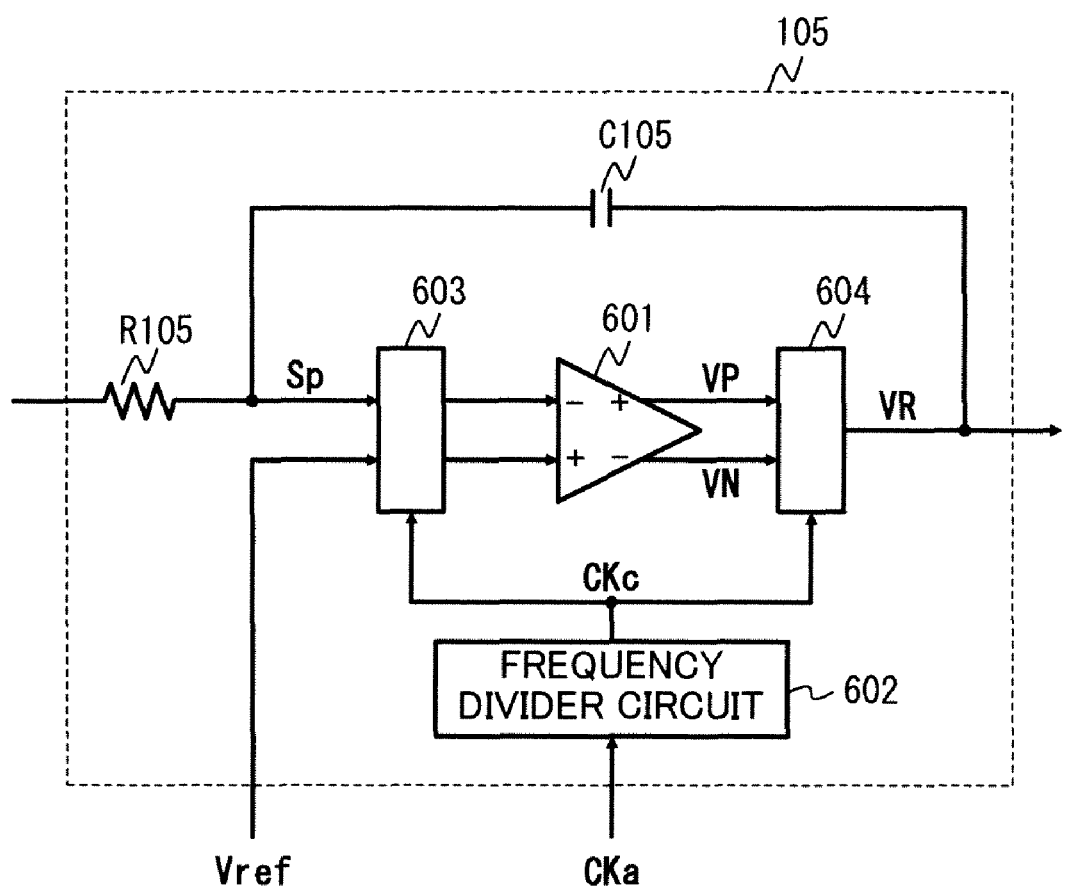
FIG. 16 is a diagram describing a variation of an RC filter.

As shown in FIG. 16, the RC filter 105 may include, instead of the differential amplifier circuit A105, a differential amplifier circuit 601 configured to output a pair of output voltages VP and VN corresponding to a difference between the signal level of the intermediate signal Sp and the reference voltage Vref, a frequency divider circuit 602 configured to divide the frequency of the reference clock CKa and output the resultant clock as a control clock CKc, and switches 603 and 604 (chopper circuit) configured to operate in response to the control clock CKc. For example, when the control clock CKc is at the high level, the switch 603 supplies the intermediate signal Sp to the inverting input terminal of the differential amplifier circuit 601, and supplies the reference voltage Vref to a non-inverting input terminal of the differential amplifier circuit 601. The switch 604 selects the output voltage VP output from the non-inverting output terminal of the differential amplifier circuit 601 and outputs the output voltage VP as the comparison voltage VR. When the control clock CKc is at the low level, the switch 603 supplies the intermediate signal Sp to the non-inverting input terminal of the differential amplifier circuit 601, and supplies the reference voltage Vref to the inverting input terminal of the differential amplifier circuit 601. The switch 604 selects the output voltage VN output from an inverting output terminal of the differential amplifier circuit 601 and outputs the output voltage VN as the comparison voltage VR. As described above, the correspondence relationship of the intermediate signal Sp and the reference voltage Vref to the inverting input terminal and the non-inverting input terminal of the differential amplifier circuit 601 is periodically changed, and the output voltages VP and VN are alternately selected as the comparison voltage VR. Thus, flicker noise (noise components which are inversely proportional to an element size) in the differential amplifier circuit 601 is caused to spread around harmonics whose frequency is an integral multiple of a chopper frequency (the frequency of the control clock CKc). The flicker noise spread over the harmonics is attenuated by the RC filter 105.

Figure 17A:
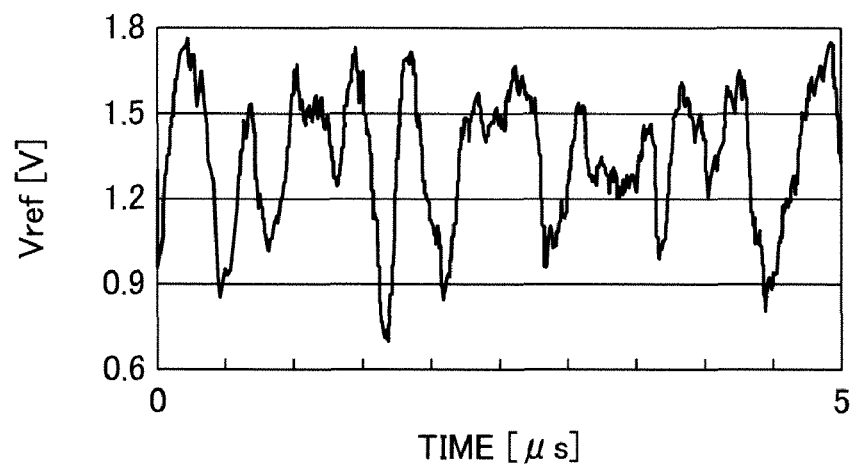
FIG. 17A is a waveform diagram of a comparison voltage when a chopper technique is not used.
Figure 17B:
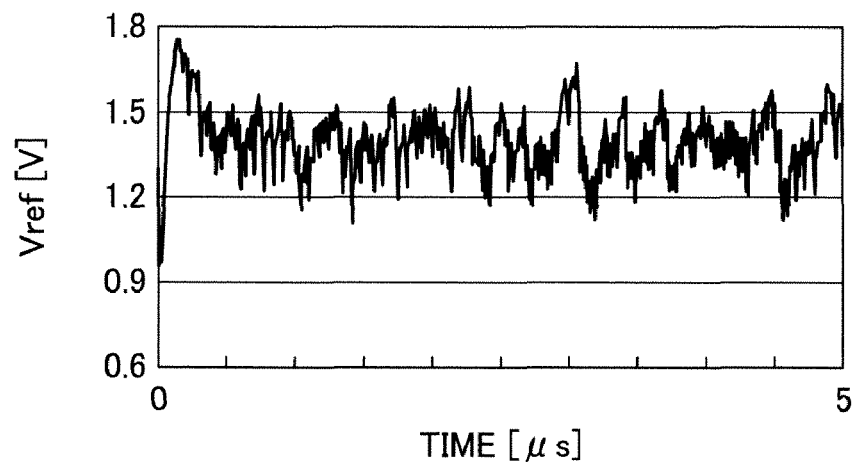
FIG. 17B is a waveform diagram of a comparison voltage when a chopper technique is used.
Figure 18:
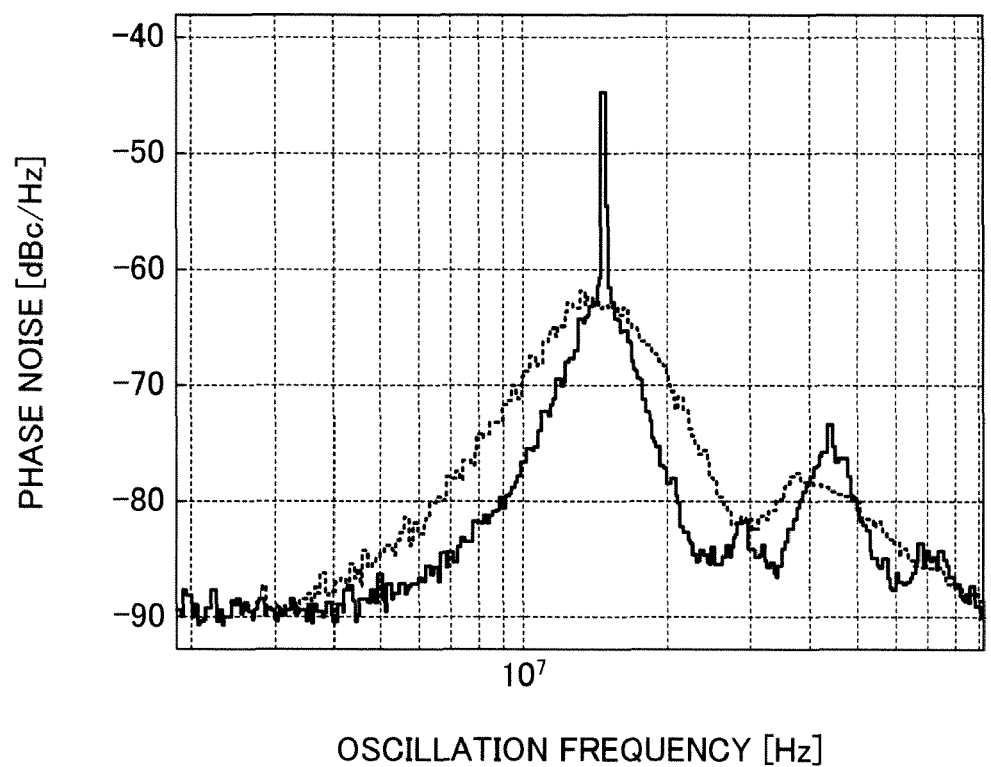
FIG. 18 is a graph describing advantages achieved by using the chopper technique.

As has been described above, flicker noise superimposed on the comparison voltage VR can be reduced by applying the known chopper technique to the RC filter 105. For example, when the chopper technique is not used, as shown in FIG. 17A, the comparison voltage VR fluctuates slowly with a large amplitude. On the other hand, when the chopper technique is used, as shown in FIG. 17B, the comparison voltage VR fluctuates intensely with a small amplitude. As described above, the fluctuation range of the comparison voltage VR can be reduced, and therefore, as shown in FIG. 18, the resonance characteristic (Q factor) of the reference frequency generation circuit can be further improved. Note that in FIG. 18, the dashed line waveform corresponds to the resonance characteristic when the chopper technique is not used, and the solid line waveform corresponds to the resonance characteristic when the chopper technique is used. Moreover, when the chopper technique is used, the circuit area does not have to be increased to reduce flicker noise. Therefore, the circuit area of the reference frequency generation circuit can be reduced, compared to the circuit area when the chopper technique is not used.

Also, a charging/discharging time of a load capacitance (e.g., a parasite capacitance on a signal path) by the differential amplifier circuit 601 can be increased, as compared to the case where the switches 603 and 604 are controlled using the reference clock CKa, by reducing the frequency of the control clock CKc to be lower than the frequency of the reference clock CKa. Thus, the drive capability of the differential amplifier circuit 601 can be reduced, so that the power consumption of the differential amplifier circuit 601 can be reduced. Note that, instead of the reference clock CKa, an internal signal (e.g., the reference clock CKb, and the oscillation signals OSCa and OSCb, etc.) of the reference frequency generation circuit, or an external clock may be supplied to the frequency divider circuit 602. Also, the internal signal of the reference frequency generation circuit or an external clock may be supplied as the control clock CKc to the switches 603 and 604 directly, not via the frequency divider circuit 602.

Note that the chopper technique is applicable not only to the RC filter 105 but also to the RC filters 105a, 105b, 105c, and 105d. That is, each of the RC filters 105a, 105b, 105c, and 105d may include, instead of the differential amplifier circuit A105, the differential amplifier circuit 601, the frequency divider circuit 602, and the switches 603 and 604 of FIG. 16.

(Frequency Adjustment)

In the above-described embodiments, the constant current source(s) (or the resistor(s)) and the capacitor(s) based on which the time constants of the oscillator circuits 11, 21, and 41 are determined may be replaced respectively with a variable current source(s) (or a variable resistor(s)) and variable capacitor(s). With such a configuration, the time constant of each of the oscillator circuits 11, 21, and 41 can be changed, so that the frequency of the reference clock can be adjusted.

Figure 19C:
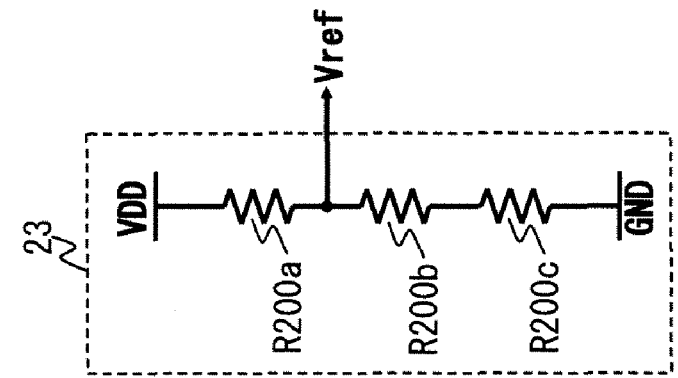
FIGS. 19A, 19B and 19C are diagrams describing variations of a reference voltage generation circuit.
Figure 19B:
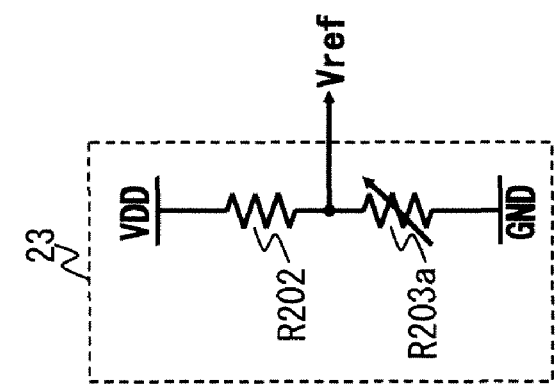
Figure 19A:
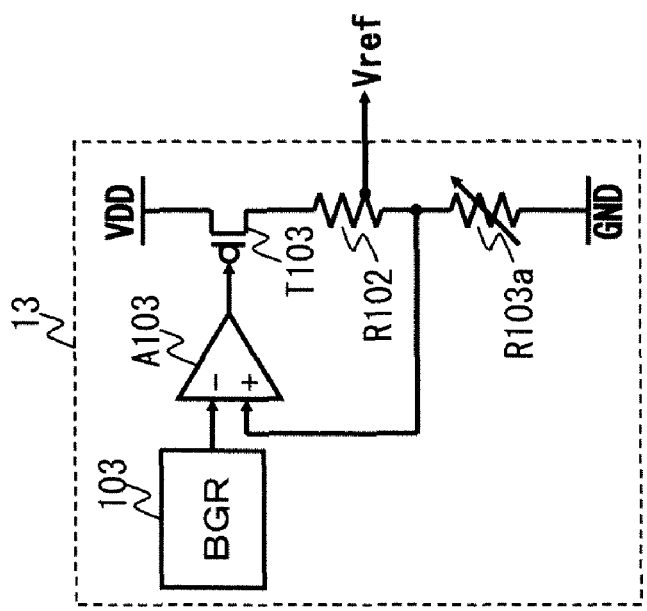

As shown in FIG. 19A, in the reference voltage generation circuit 13, the resistor R103 may be replaced with a variable resistor R103a and, as shown in FIG. 19B, in the reference voltage generation circuit 23, the resistor R203 may be replaced with a variable resistor R203a. With such a configuration, the reference voltage Vref can be caused to be a variable voltage, so that the frequency of each of the reference clocks CKa and CKb can be adjusted. Moreover, the frequency of each of the reference clocks CKa and CKb can be adjusted without adding any additional configuration (a configuration to allow the time constant to be variable) to the oscillator circuit, and thus, the time constant of the oscillator circuit does not include any unnecessary component (e.g., a resistance component which a switch of a variable resistor has, etc.). Therefore, the frequency of each of the reference clocks CKa and CKb can be accurately set.

(Temperature Gradient Characteristic)

In each of the above-described embodiments, when the time constant of each of the oscillator circuits 11, 21, and 41 has a temperature gradient characteristic (i.e., when the time constant of the oscillator circuit fluctuates with change in temperature), the frequencies of the reference clocks CKa and CKb fluctuate with fluctuations in the time constant. To reduce such fluctuations in the frequencies, the reference voltage Vref may be caused to have any temperature gradient characteristic (e.g., a temperature gradient characteristic exhibiting a reverse temperature gradient to the temperature gradient for the time constant). For example, as shown in FIG. 19C, a reference voltage generation circuit 23 may be configured using a resistor R200a, a resistor R200b having the same temperature coefficient (the ratio of the amount of change in resistance value to the amount of change in temperature) as that of the resistor R200a, and a resistor R200c having a different temperature coefficient from that of the resistor R200a. The resistors R200a, R200b, and R200c may have different temperature coefficients. With the above-described configuration, the dividing ratio for dividing a voltage by the resistors varies with change in temperature and, as a result, the reference voltage Vref has a temperature gradient characteristic. Note that in process steps for fabricating a semiconductor integrated circuit, various types of resistors (e.g., a polysilicon resistor, a diffused resistor, a well resistor, etc.) can be selected and used as the resistors R200a, R200b, and R200c, and thus each of the respective temperature coefficients of the resistors R200a, R200b, and R200c can be set arbitrarily.

As described above, the reference voltage Vref has a temperature gradient characteristic, so that the temperature gradient characteristic of the time constant of the oscillator circuit can be cancelled (or reduced), and fluctuations in the frequencies of the reference clocks CKa and CKb due to change in temperature can be reduced. For example, when the time constant of the oscillator circuit has a positive temperature gradient characteristic (in which the value of the time constant increases with increase in temperature), fluctuations in the frequencies due to change in temperature can be reduced by causing the reference voltage Vref to have a negative temperature gradient characteristic (in which the voltage value reduces with increase in temperature). Note that in the reference voltage generation circuit 13, an output of the band gap reference circuit 103 may be caused to have a temperature gradient characteristic. With the above-described configuration, the reference voltage Vref can be caused to have a temperature gradient characteristic.

(Semiconductor Integrated Circuit and Electronic Device)

Figure 20:
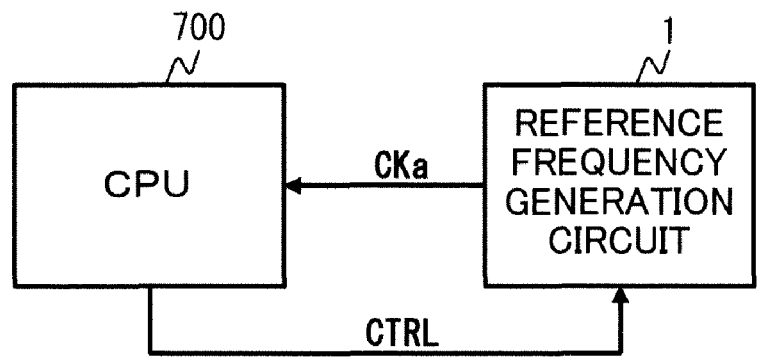
FIG. 20 is a diagram illustrating an example configuration of a semiconductor integrated circuit including the reference frequency generation circuit of FIG. 1.

As shown in FIG. 20, each of the reference frequency generation circuits 1, 2, 3, and 4 can be mounted to a semiconductor integrated circuit. A semiconductor integrated circuit 7 of FIG. 20 includes, in addition to the reference frequency generation circuit 1, a CPU 700. The CPU 700 operates using the reference clock CKa from the reference frequency generation circuit 1 as an operation clock. If the frequency of the reference clock is adjustable in the reference frequency generation circuit 1, the CPU 700 may adjust, based on external information (e.g., temperature information etc.), the frequency of the reference clock of the reference frequency generation circuit 1 (e.g., may adjust the resistance value of the resistance R103a of the reference voltage generation circuit 13). Furthermore, when each of the time constants of the oscillator circuits 11, 21, and 41 has a temperature gradient characteristic, the reference frequency generation circuit can be used as a temperature sensor. For example, in the reference frequency generation circuit 2, when the temperature gradient characteristic of each of the resistors R201a and R201b, and the correspondence relationship between the resistance values of the resistors R201a and R201b and the frequencies of the reference clocks CKa and CKb are known in advance, the amount of change in temperature can be obtained based on fluctuations in the frequencies of the reference clocks CKa and CKb.

Figure 21:
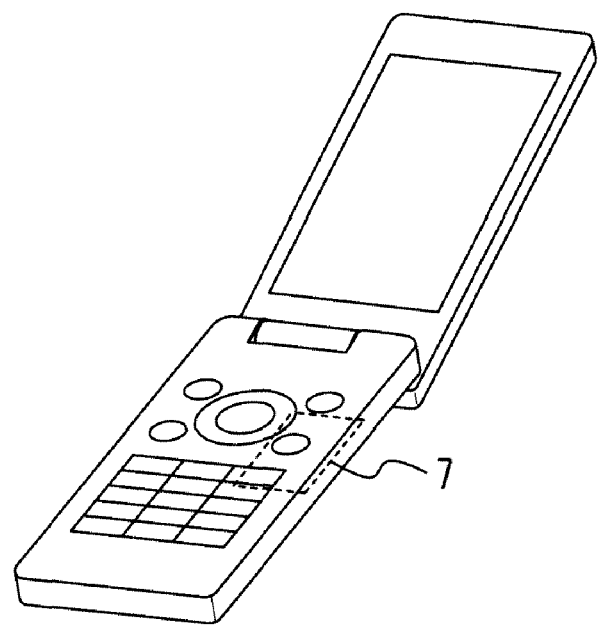
FIG. 21 is a view illustrating an example configuration of an electronic equipment including the semiconductor integrated circuit of FIG. 20.

As shown in FIG. 21, the semiconductor integrated circuit 7 can be mounted to an electronic device such as a mobile device etc. As described above, with any one of the reference frequency generation circuits 1, 2, 3, and 4 mounted to a semiconductor integrated circuit or an electronic device, the semiconductor integrated circuit or the electronic device can be accurately operated.

(Variations of Oscillator Circuit and Oscillation Control Circuit)

Figure 22:
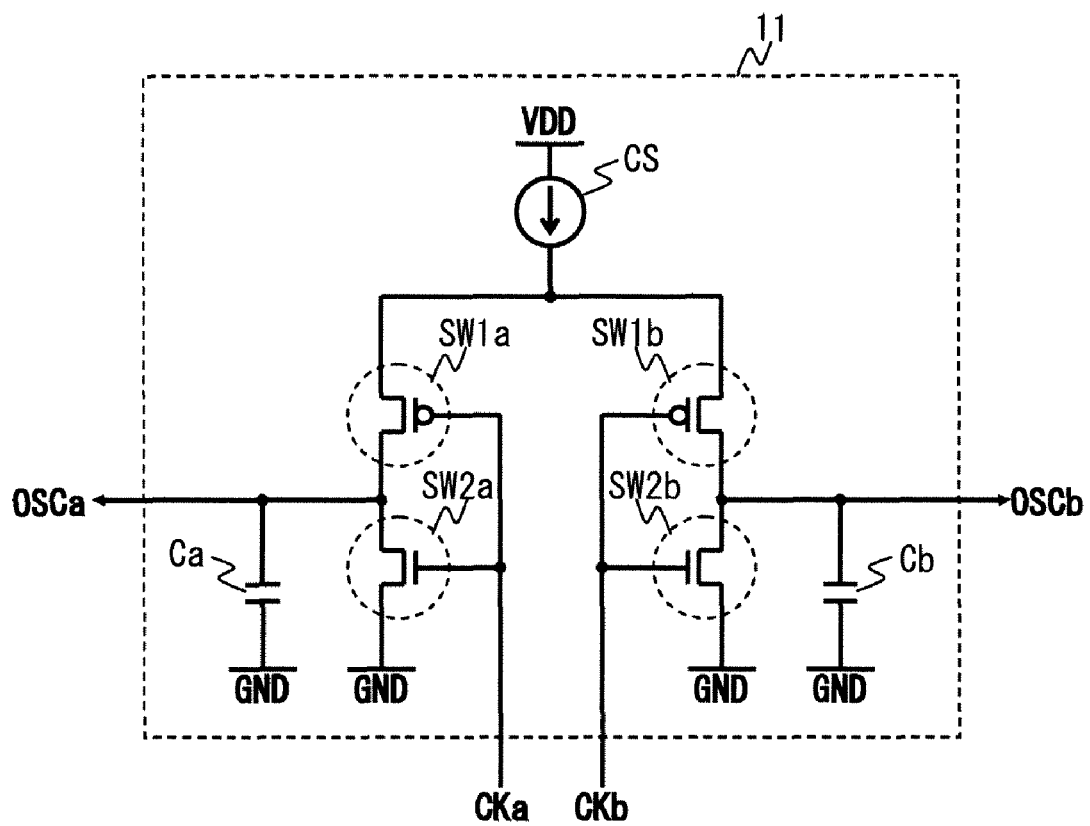
FIG. 22 is a diagram describing a variation of an oscillator circuit.
Figure 25A:
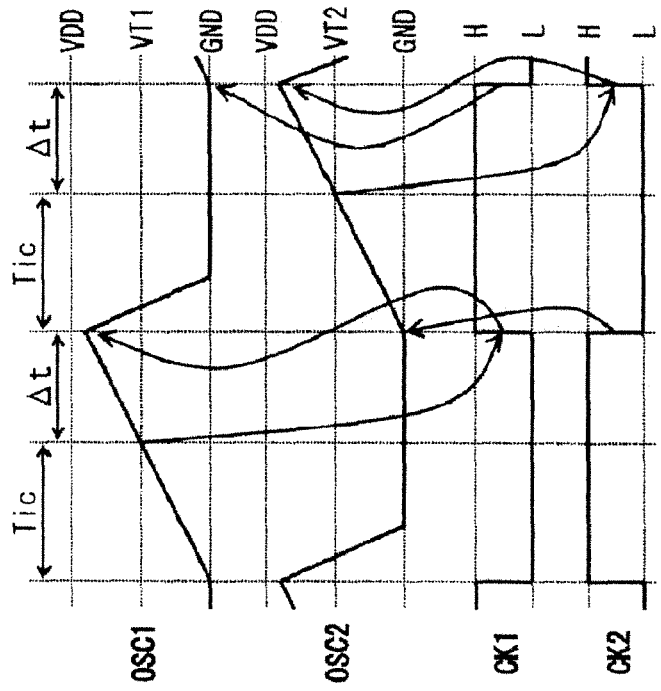
FIG. 25A is a diagram illustrating a configuration of a conventional differential-type reference frequency generation circuit.
Figure 25B:
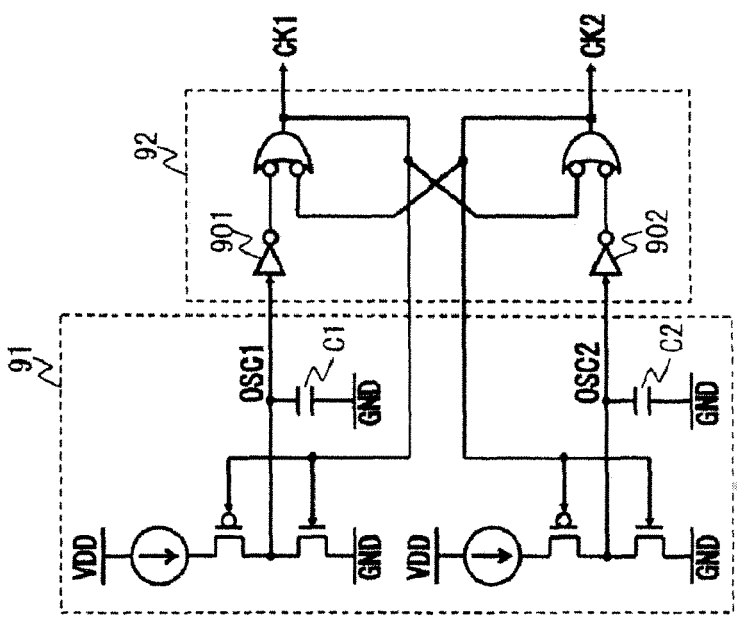
FIG. 25B is a timing chart showing an operation of the reference frequency generation circuit of FIG. 25A.

Note that the differential oscillator circuit 11 and 21 can be formed in various different configurations, and the configurations of the oscillator circuits 11 and 21 are not limited to the configurations of FIG. 1 and FIG. 5. For example, the oscillator circuit 11 does not have to include the switches SW1a and SW1b. Also, as shown in FIG. 22, the oscillator circuit 11 may include, instead of the two constant current sources CS101a and CS101b, a constant current source CS to be alternately connected to the capacitors Ca and Cb. Similarly, the oscillator circuit 21 do not have to include the switches SW1a and SW1b, and may have a configuration in which the constant current source CS of FIG. 22 is replaced with a resistor. Also, the configuration of the differential oscillation control circuit 12 is not limited to the configuration of FIG. 1. For example, the oscillation control circuit 12 may include, instead of the NAND-type RS latch circuit 102, a NOR-type RS latch circuit or a combination of other logic elements. Also, the oscillation control circuit 12 may have the configuration of FIG. 25A. Similarly, the single-type oscillator circuit 41 and the single-type oscillation control circuit 42 can be formed in various different configurations, and the configurations of the oscillator circuit 41 and the oscillation control circuit 42 are not limited to the configurations of FIG. 13.

(Polarity of Reference Frequency Generation Circuit)

Figure 23:
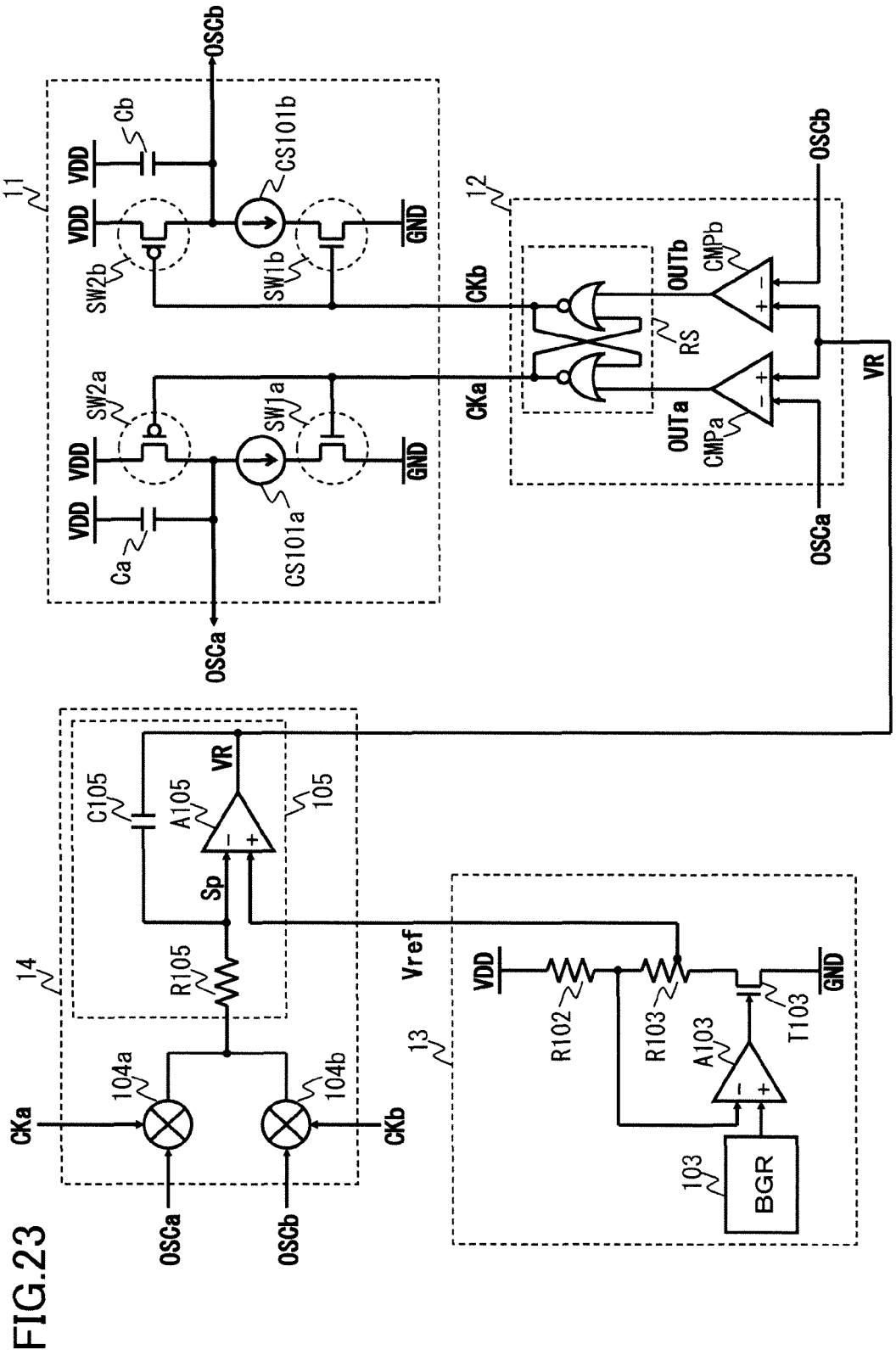
FIG. 23 is a diagram describing a variation of the reference frequency generation circuit of FIG. 1.
Figure 24A:
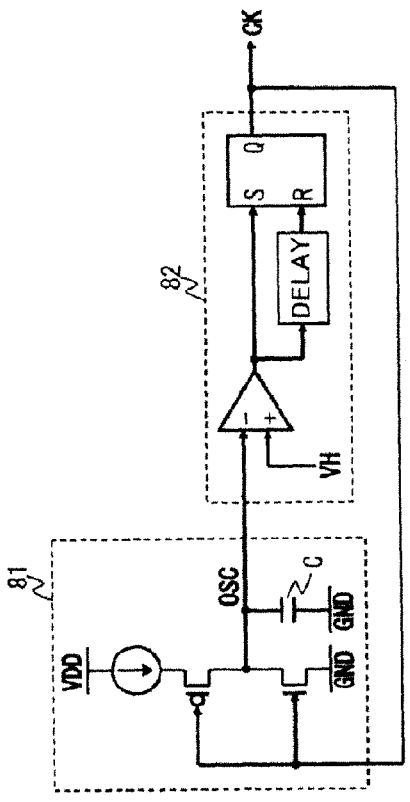
FIG. 24A is a diagram illustrating a configuration of a conventional single-type reference frequency generation circuit.
Figure 24B:
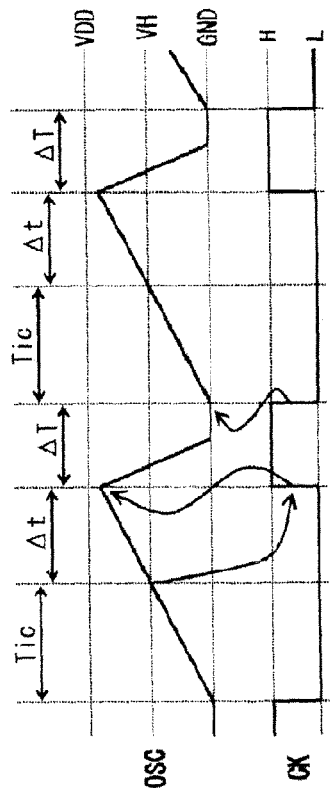
FIG. 24B is a timing chart showing an operation of the reference frequency generation circuit of FIG. 24A.

In each of the above-described embodiments, the polarity of each of the reference frequency generation circuits 1, 2, 3, and 4 may be reversed. That is, each of the reference frequency generation circuits 1, 2, 3, and 4 may serve to reduce the signal level of an oscillation signal with a predetermined time constant. For example, the reference frequency generation circuit 1 of FIG. 1 may be formed to have the configuration of FIG. 23. In the reference frequency generation circuit of FIG. 23, the oscillator circuit 11 alternately performs, in response to transitions of the signal levels of the reference clocks CKa and CKb, an operation to increase the signal level of the oscillation signal OSCa and reduce the signal level of the oscillation signal OSCb with an IC time constant, and an operation to reduce the signal level of the oscillation signal OSCa with the IC time constant and increase the signal level of the oscillation signal OSCb. When detecting that the signal level of the oscillation signal OSCa (or the signal level of the oscillation signal OSCb) has fallen below the comparison voltage VR, the oscillation control circuit 12 causes the signal levels of the reference clocks CKa and CKb to transition. The reference voltage generation circuit 13 generates, as the reference voltage Vref, a low voltage with a predetermined potential difference between the low voltage and the power supply voltage VDD. Even with the above-described configuration, fluctuations in the frequency of a reference clock due to fluctuations in delay time can be reduced.

As described above, the reference frequency generation circuit can accurately generate a reference clock having a high frequency while increase in power consumption can be reduced, and therefore, is useful for use in a timer of a semiconductor integrated circuit, generating an operation clock, and generating a sampling clock, etc.

Note that the foregoing embodiments have been set forth merely for purposes of preferred examples in nature, and are not intended to limit the scope, applications, and use of the invention.

What is claimed is:

1. A reference frequency generation circuit which generates a reference clock, the circuit comprising:
an oscillator circuit configured to alternately perform, in response to a transition of a signal level of the reference clock, an operation to increase a signal level of a first oscillation signal and reduce a signal level of a second oscillation signal, and an operation to increase the signal level of the second oscillation signal and reduce the signal level of the first oscillation signal;
an oscillation control circuit configured to cause, when detecting that the signal level of the first oscillation signal has reached a comparison voltage, the signal level of the reference clock to transition to a first logic level, and cause, when detecting that the signal level of the second oscillation signal has reached the comparison voltage, the signal level of the reference clock to transition to a second logic level; and
a reference control circuit configured to increase or reduce the comparison voltage so that a difference between a signal level of an intermediate signal which is proportional to respective swings of the first and second oscillation signals and a reference voltage is reduced.

2. The reference frequency generation circuit of claim 1, wherein
the reference control circuit includes
first and second resistors configured to respectively cause the first and second oscillation signals to pass therethrough, and
an RC filter configured to extract, as the intermediate signal, from a synthesized signal obtained by synthesizing the first and second oscillation signals which have passed respectively through the first and second resistors, the signal which is proportional to a swing of the synthesized signal, and output, as the comparison voltage, a voltage corresponding to a difference between a signal level of the extracted intermediate signal and the reference voltage.

3. The reference frequency generation circuit of claim 1, wherein
the reference control circuit includes
a switching circuit configured to alternately causes, in response to the transition of the signal level of the reference clock, the first and second oscillation signals to pass therethrough, and
an RC filter configured to extract, as the intermediate signal, a signal which is proportional to a swing of the oscillation signal from the oscillation signal which has passed through the switching circuit, and output, as the comparison voltage, a voltage corresponding to a difference between a signal level of the extracted intermediate signal and the reference voltage.

4. The reference frequency generation circuit of claim 1, further comprising:
a reference voltage generation circuit configured to divide a voltage between a first voltage and a second voltage by resistors to generate the reference voltage,
wherein
the oscillator circuit includes
first and second capacitors configured to respectively generate the first and second oscillation signals,
a resistive section including one or more resistors, and
a connection switching section configured to alternately switch, in response to the transition of the signal level of the reference clock, between first and second connection states,
in the first connection state, the first capacitor is connected, via the resistive section, to a first node to which the first voltage is supplied, and the second capacitor is connected to a second node to which the second voltage is supplied, and
in the second connection state, the second capacitor is connected, via the resistive section, to the first node, and the first capacitor is connected to the second node.

5. The reference frequency generation circuit of claim 1, further comprising:
a reference voltage generation circuit configured to generate, as the reference voltage, a constant voltage with a predetermined potential difference between the constant voltage and one of first and second voltages,
wherein
the oscillator circuit includes
first and second capacitors configured to respectively generate the first and second oscillation signals,
a current supply section configured to supply a constant current, and
a connection switching section configured to alternately switch, in response to the transition of the signal level of the reference clock, between first and second connection states,
in the first connection state, the first capacitor is connected, via the current supply section, to a first node to which the first voltage is supplied, and the second capacitor is connected to a second node to which the second voltage is supplied, and
in the second connection state, the second capacitor is connected, via the current supply section, to the first node, and the first capacitor is connected to the second node.

6. The reference frequency generation circuit of claim 1, further comprising:
an initialization circuit configured to initialize the signal level of the comparison voltage to be a predetermined signal level.

7. The reference frequency generation circuit of claim 1, wherein
the reference voltage is a variable voltage.

8. The reference frequency generation circuit of claim 1, wherein
the reference voltage has a temperature gradient.

9. A reference frequency generation circuit which generates a reference clock, the circuit comprising:
an oscillator circuit configured to alternately perform, in response to a transition of a signal level of the reference clock, an operation to increase a signal level of an oscillation signal, and an operation to reduce the signal level of the oscillation signal;
an oscillation control circuit configured to cause, when detecting that the signal level of the oscillation signal has reached a comparison voltage, the signal level of the reference clock to transition to a first logic level, and causes, after a predetermined time has elapsed, the signal level of the reference clock to transition to a second logic level; and
a reference control circuit configured to increase or reduce the comparison voltage so that a difference between a signal level of an intermediate signal which is proportional to a swing of the oscillation signal and a reference voltage is reduced.

10. The reference frequency generation circuit of claim 9, wherein
the reference control circuit includes
an RC filter configured to extract the intermediate signal from the oscillation signal, and output, as the comparison voltage, a voltage corresponding to a difference between a signal level of the extracted intermediate signal and the reference voltage.

11. The reference frequency generation circuit of claim 2, wherein
the RC filter includes
a differential amplifier circuit including a pair of input terminals which respectively correspond the intermediate signal and the reference voltage and configured to output a pair of output voltages which correspond to the difference between the signal level of the intermediate signal and the reference voltage, and
a chopper circuit configured to periodically change a correspondence relationship between the intermediate signal and the reference voltage and the pair of input terminals, and alternately selecting, as the comparison voltage, one and the other of the pair of output voltages.

12. The reference frequency generation circuit of claim 11, wherein
the RC filter further includes a frequency divider circuit configured to divide the frequency of the reference clock, and
the chopper circuit performs, in response to an output of the frequency divider circuit, switching of the correspondence relationship and selection of the output voltage.

13. A semiconductor integrated circuit, comprising:
the reference frequency generation circuit of claim 1; and
a CPU configured to operate in synchronization with the reference clock from the reference frequency generation circuit.

14. An electronic device, comprising:
the semiconductor integrated circuit of claim 13.

* * * * *